United States Patent [19]
Whetsel

[11] Patent Number: 5,001,713
[45] Date of Patent: Mar. 19, 1991

[54] EVENT QUALIFIED TESTING ARCHITECTURE FOR INTEGRATED CIRCUITS

[75] Inventor: Lee D. Whetsel, Plano, Tex.

[73] Assignee: Texas Instruments Incorporated, Dallas, Tex.

[21] Appl. No.: 308,272

[22] Filed: Feb. 8, 1989

[51] Int. Cl.$^5$ .......................................... G01R 31/28
[52] U.S. Cl. .................................. 371/22.3; 371/22.4
[58] Field of Search ................... 371/22.3, 22.4, 25.1, 371/71

[56] References Cited

U.S. PATENT DOCUMENTS

| | | | |
|---|---|---|---|
| 4,598,401 | 7/1986 | Whelan | 371/22.4 |
| 4,635,261 | 1/1987 | Anderson et al. | 371/22.4 |
| 4,801,870 | 1/1989 | Eichelberger et al. | 371/22.4 |
| 4,857,835 | 8/1989 | Whetsel, Jr. | 371/18 |
| 4,860,288 | 8/1989 | Teske et al. | 371/1 |
| 4,872,169 | 10/1989 | Whetsel, Jr. | 371/22.3 |
| 4,875,003 | 10/1989 | Burke | 371/25.1 |
| 4,893,072 | 1/1990 | Matsumoto | 371/22.3 |

OTHER PUBLICATIONS

Sellers et al., Error Detecting Logic for Digital Computers, McGraw-Hill Co., 1968, pp. 207–211.

Primary Examiner—Charles E. Atkinson
Attorney, Agent, or Firm—B. Peter Barndt; James T. Comfort; Melvin Sharp

[57] ABSTRACT

A boundary test architecture for use in an integrated circuit (10) comprises input and output test registers (12, 22) having functions controlled by an event qualifying module (EQM) (30). The EQM (30) receives a signal from the output test register (22) indicating that a matching condition has been met. In response to a matching condition, EQM (30) may control the input and output test registers (12, 22) to perform a variety of tests on the incoming and outgoing data. During testing, the internal logic (20) may continue to operate at-speed, thereby allowing the test circuitry to detect faults which would not otherwise be discoverable. A memory buffer (64) may be included to store a plurality of input data for test data.

51 Claims, 9 Drawing Sheets

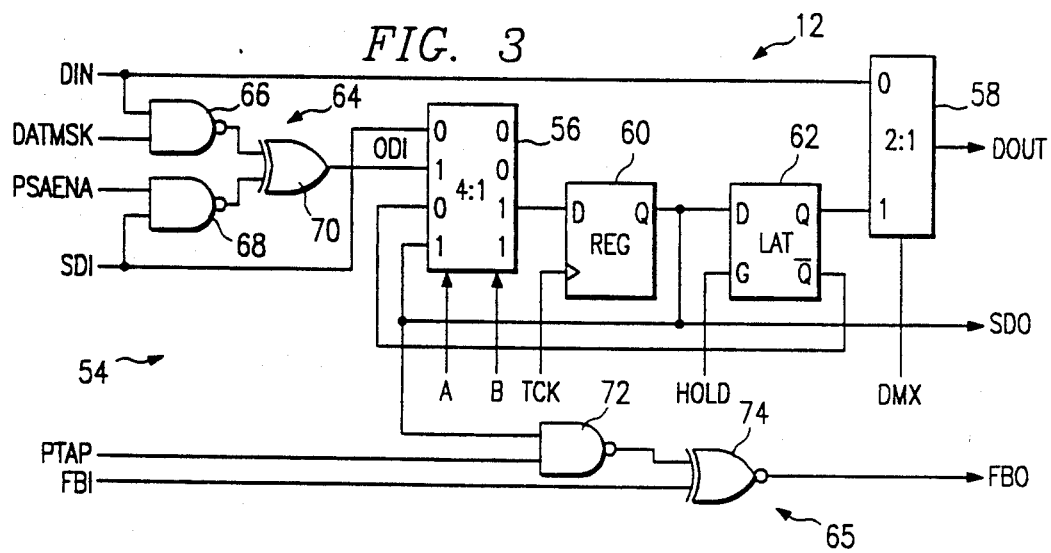
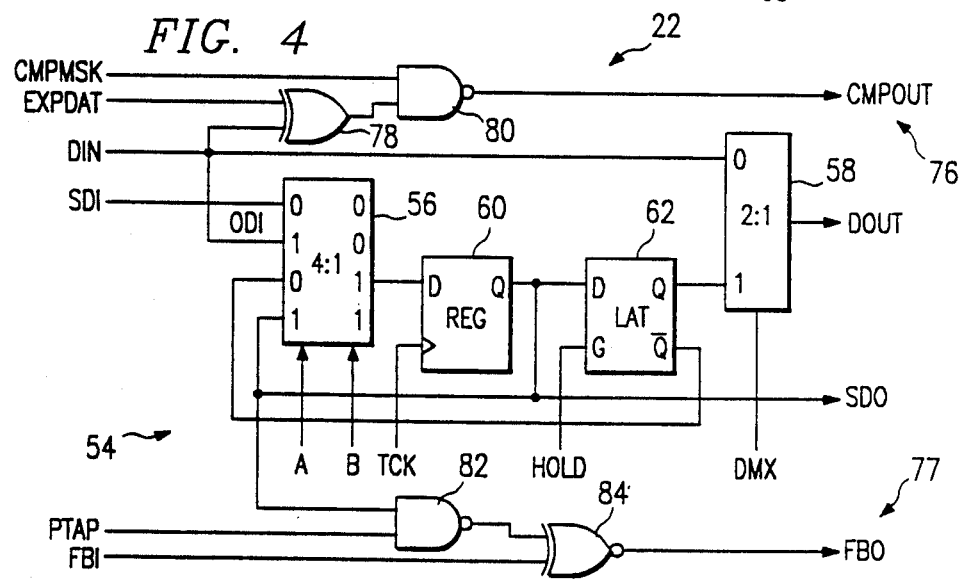
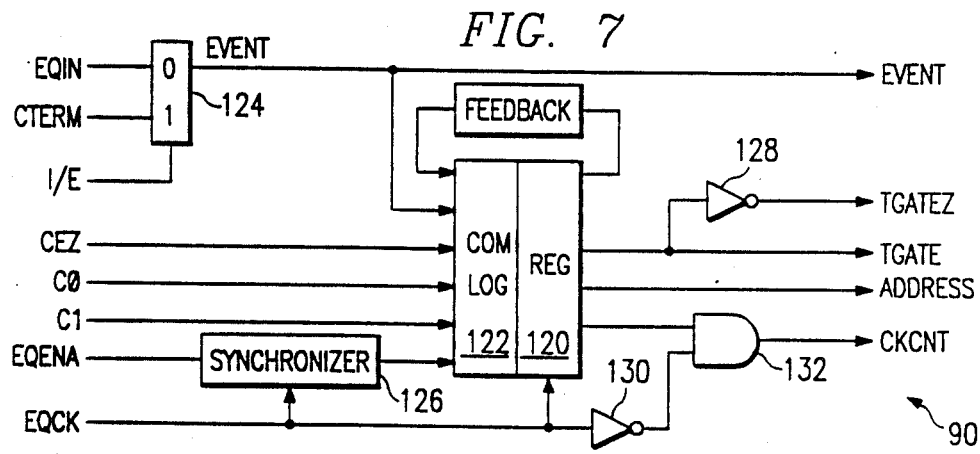

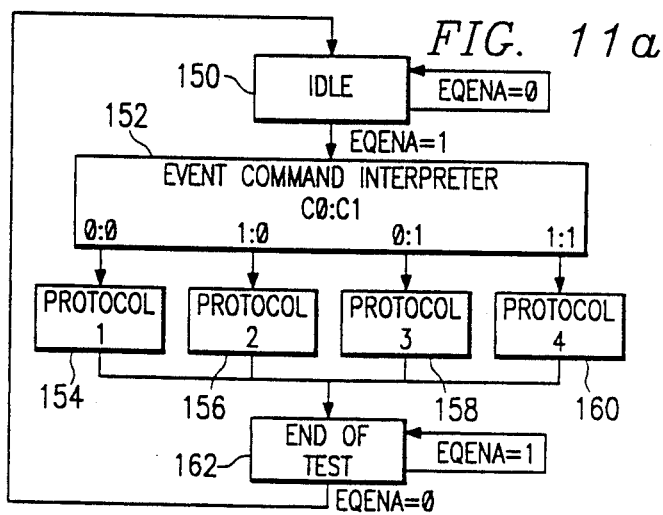
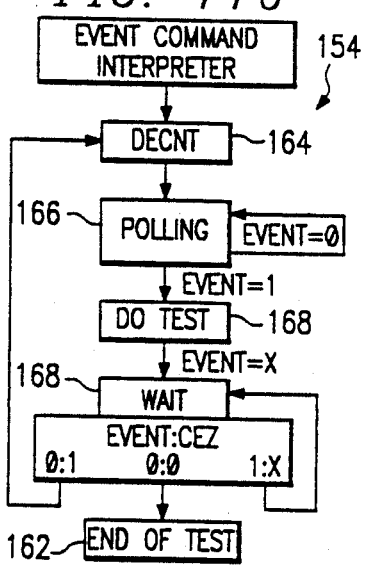
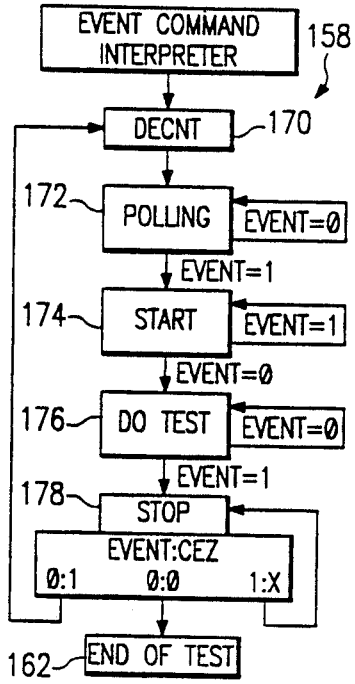
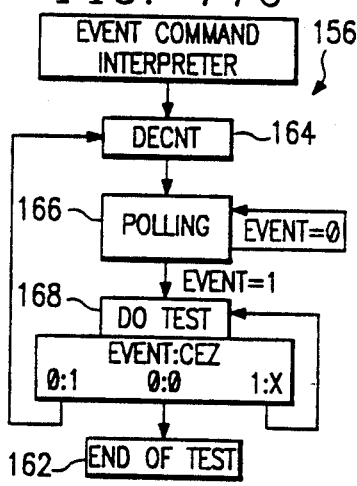

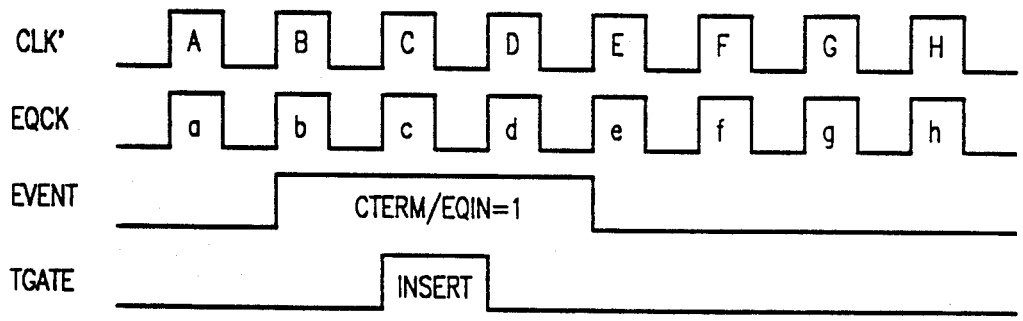
FIG. 12  PROTOCOL-1
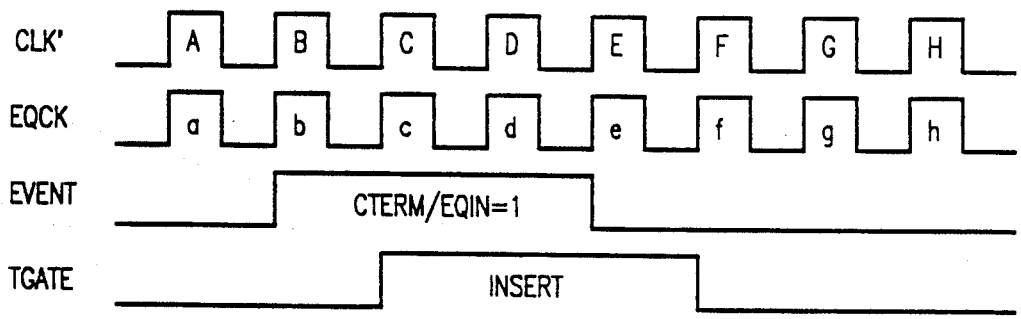
FIG. 13  PROTOCOL-2
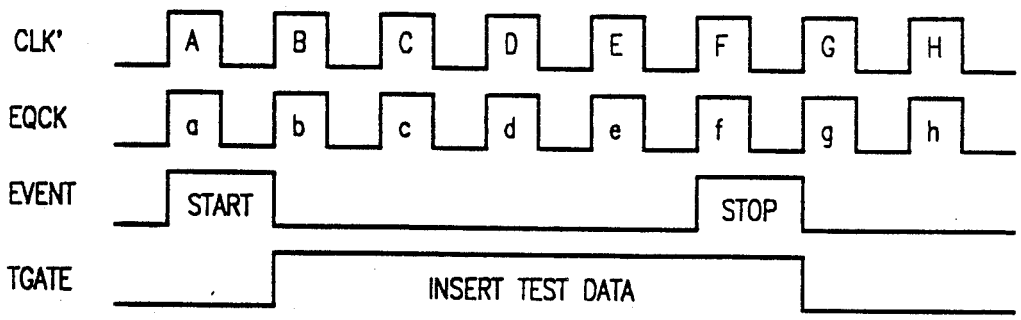
FIG. 14  PROTOCOL-3
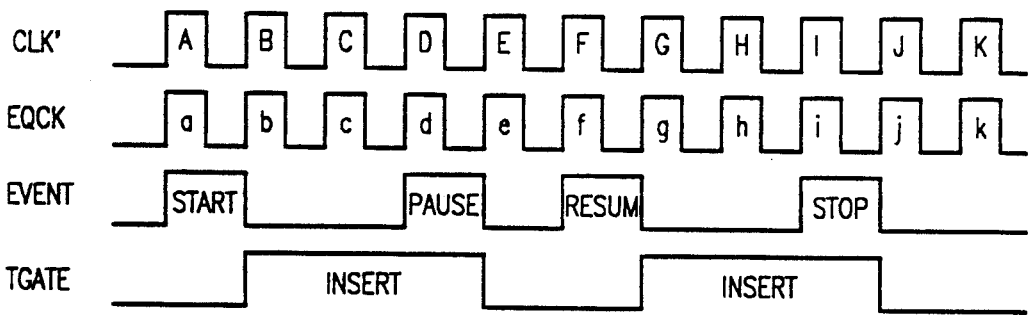
FIG. 15  PROTOCOL-4

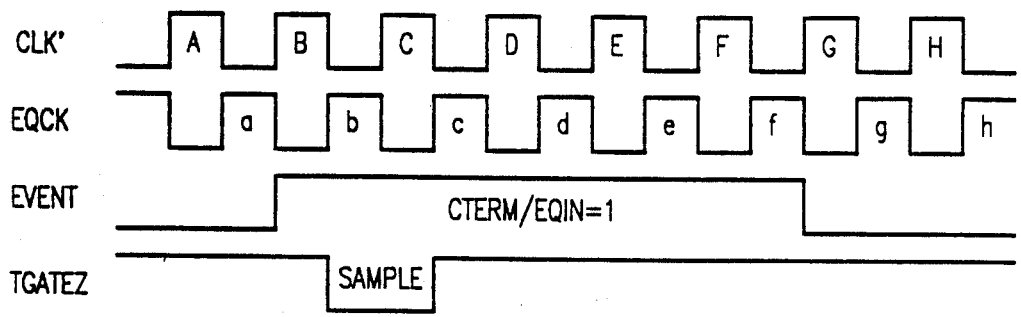
FIG. 16a  PROTOCOL-1
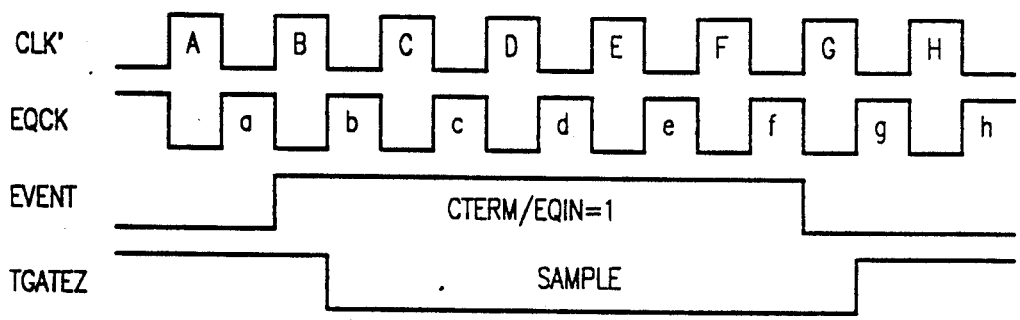
FIG. 16b  PROTOCOL-2
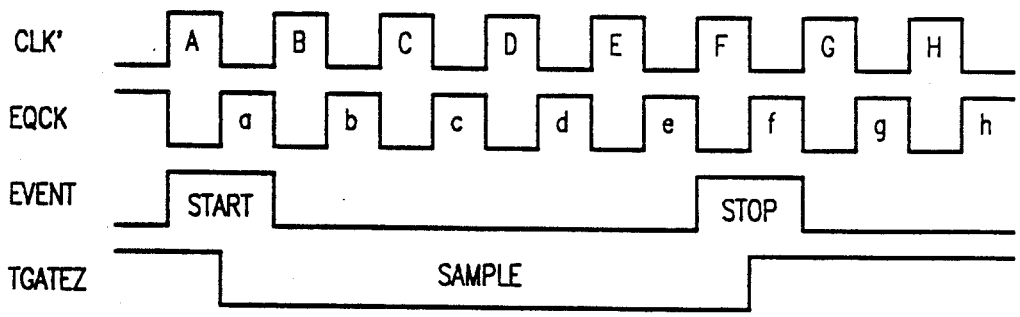
FIG. 16c  PROTOCOL-3
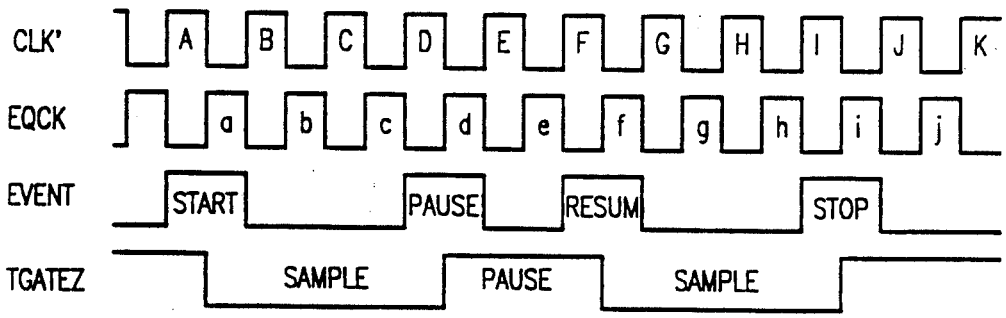
FIG. 16d  PROTOCOL-4

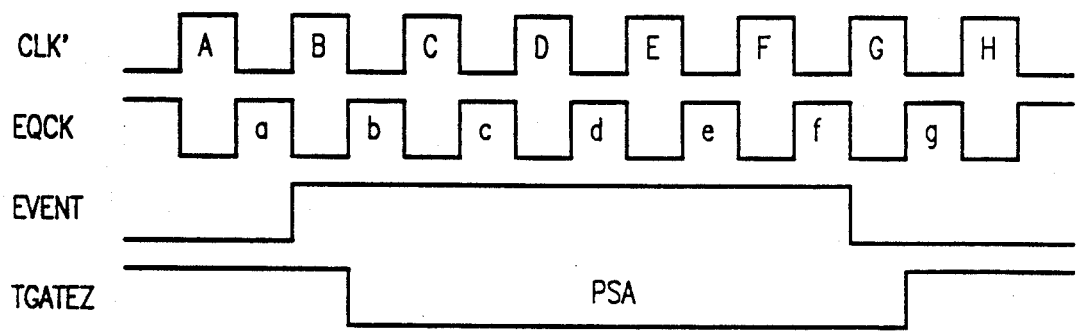
FIG. 17  PROTOCOL-2
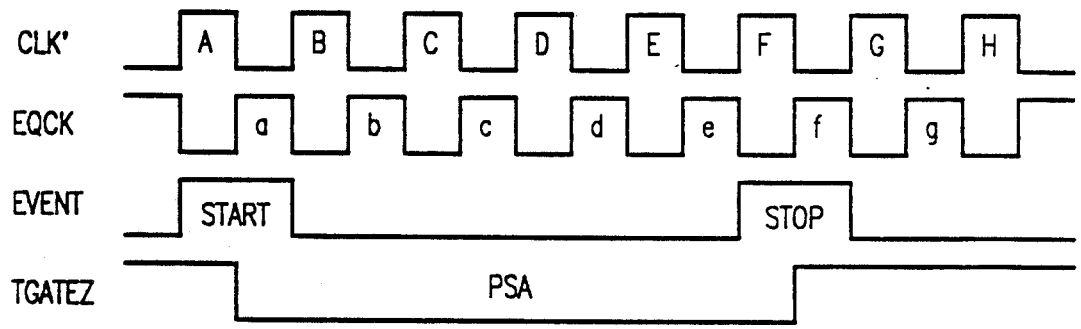
FIG. 18  PROTOCOL-3
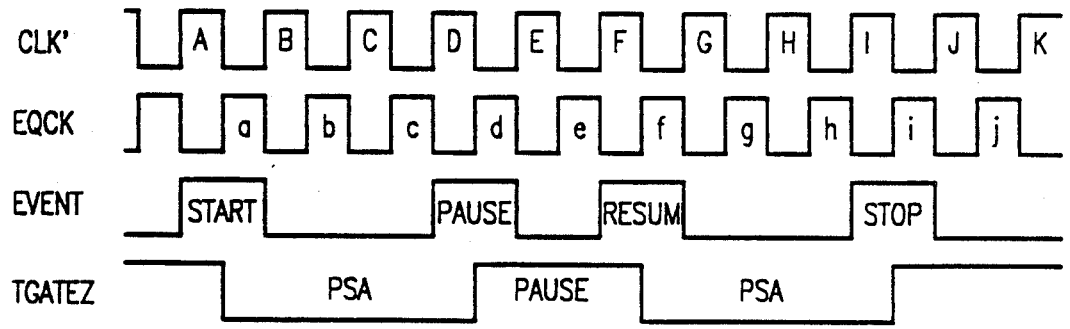
FIG. 19  PROTOCOL-4

EVENT QUALIFIED TESTING ARCHITECTURE FOR INTEGRATED CIRCUITS

RELATED APPLICATIONS

This Application is related to co-pending Application for U.S. Letter patent Ser. No. 07/308,273, filed concurrently, entitled "Event Qualified Testing Protocols For Integrated Circuits."

TECHNICAL FIELD OF THE INVENTION

This invention relates in general to integrated circuits, and more particularly to an event qualified testing architecture for providing at-speed testing while the host integrated circuit is operating normally.

BACKGROUND OF THE INVENTION

Traditionally, boundary scan testing has been used to perform simple testing of the wiring interconnects between integrated circuits on a board assembly. During test, the integrated circuits on the board are placed in a non-functioning test mode, and their boundary scan paths are accessed to verify the wiring connections between all input and output pins of each integrated circuit on the board.

The ability to dynamically observe the data passing through integrated circuit boundaries in real time provides a method of monitoring the functional interactions between multiple integrated circuits on a board. Such a test can be used to reveal timing sensitive and/or intermittent failures that would otherwise not be detectable without the use of expensive testers and mechanical probing fixtures. Dynamic boundary observation facilitates system integration, environmental chamber testing, remote diagnostic testing, and built-in self testing. The ability to dynamically control the data passing through integrated circuit boundaries in real time provides a method of inserting test data at the input and/or output of one or more integrated circuits on a board. This capability allows a fault to be propagated into a functioning circuit to see if: (1) the circuit can tolerate the fault; and (2) the circuit can detect the occurrence of the fault. The ability to introduce a knoWn fault into a circuit provides a method of verifying that back-up circuitry responds in time to maintain normal system operation in fault tolerant designs.

Because circuits are placed in a non-functioning test mode during prior methods of boundary scan testing, errors that may occur only while the board is in operation may not be observable. Hence, this type of static boundary testing is limited in the errors which it may detect. Further, in many applications it may be necessary to test the circuit without impeding normal operation. For example, if a circuit is being used in an aircraft control system, it may not be possible to disable the circuit in order to provide testing while the airplane is in flight. In these cases, static boundary testing is not possible.

Therefore, a need has arisen to provide an advanced boundary test architecture which can be used to dynamically observe and control data passing through the boundary of one or more integrated circuits while the integrated circuit is operating normally in a circuit.

SUMMARY OF THE INVENTION

In accordance with the present invention, a boundary test architecture is provided which substantially eliminates or prevents the disadvantages and problems associated with prior boundary test architectures.

The boundary test architecture of the present invention may be used in an integrated circuit to perform boundary testing while the integrated circuit is in the functioning mode. Input circuitry is provided for receiving incoming data and output circuitry is provided to output data from the integrated circuit. Logic circuitry is connected between the input and output circuitry for performing a desired function, such as storage or logical operations, on the incoming data. Test circuitry is connected to the input and output circuitry for analyzing and storing data in response to detection of the predetermined condition. The predetermined condition may be detected by comparing data from the logic circuitry with expected data word stored in a register or memory. Some bits of the expected data word may be masked using a masking data word, such that the mask bits are not involved in the matching operation.

In the second embodiment of the present invention, a second predetermined condition may be detected, at which time the storage and analysis will cease. The storage and analysis may be resumed after detection of a third predetermined condition, and stop after the detection of a fourth predetermined condition.

The test architecture of the present invention provides the advantage of analyzing data from another integrated circuit while the integrated circuits are operating at speed. The at speed testing of the integrated circuits detect errors that might not otherwise be found.

In a third embodiment of the present invention, the testing architecture includes circuitry to output test data through the output circuitry in response to a predetermined condition. The output of test data may be stopped on detection of a second predetermined condition and resumed on the detection of a third predetermined condition. After a fourth predetermined condition, the output may be stopped.

This aspect of the present invention provides the technical advantage of introducing data into the circuit board while the integrated circuits are operating at speed. The ability to introduce test data onto the circuit board may be helpful to analyze the boards ability to detect faults.

In a fourth embodiment of the present invention, a buffer memory is used in the test circuit to store a plurality of input data words into the integrated circuit and test data words for output from the integrated circuit.

BRIEF DESCRIPTION OF THE DRAWINGS

For a more complete understanding of the present invention and the advantages thereof, reference is now made to the following descriptions taken in conjunction with the accompanying drawings, in which:

FIG. 3 illustrates a block diagram of the test circuits used for the data inputs of the present invention;

FIG. 4 illustrates a block diagram of the test circuits used for the data outputs in the present invention;

FIG. 7 illustrates a block diagram of the controller used in the event qualifier module of the present invention;

FIG. 11a–e illustrate flow charts showing the event qualification module protocols in the present invention;

FIG. 12 illustrates a timing diagram of a single test data insertion instruction;

FIG. 13 illustrates a timing diagram of a multiple test data insertion instruction;

FIG. 14 illustrates a timing diagram of a stop/start test data insertion instruction;

FIG. 15 illustrates a timing diagram of a start/pause/resume/stop test data insertion instruction;

FIG. 16a–d illustrate a timing diagrams of a dynamic data sample instructions;

FIG. 17 illustrates a timing diagram of a dynamic PSA instruction;

FIG. 18 illustrates a timing diagram of a stop/start PSA instruction;

FIG. 19 illustrates a timing diagram of a start/pause/resume/stop PSA instruction;

DETAILED DESCRIPTION OF THE INVENTION

The preferred embodiment of the present invention is best understood by referring to FIGS. 1–21 of the drawings, like numerals being used for like and corresponding parts of the various drawings.

Advanced Boundary Test Architecture

Figure 1:
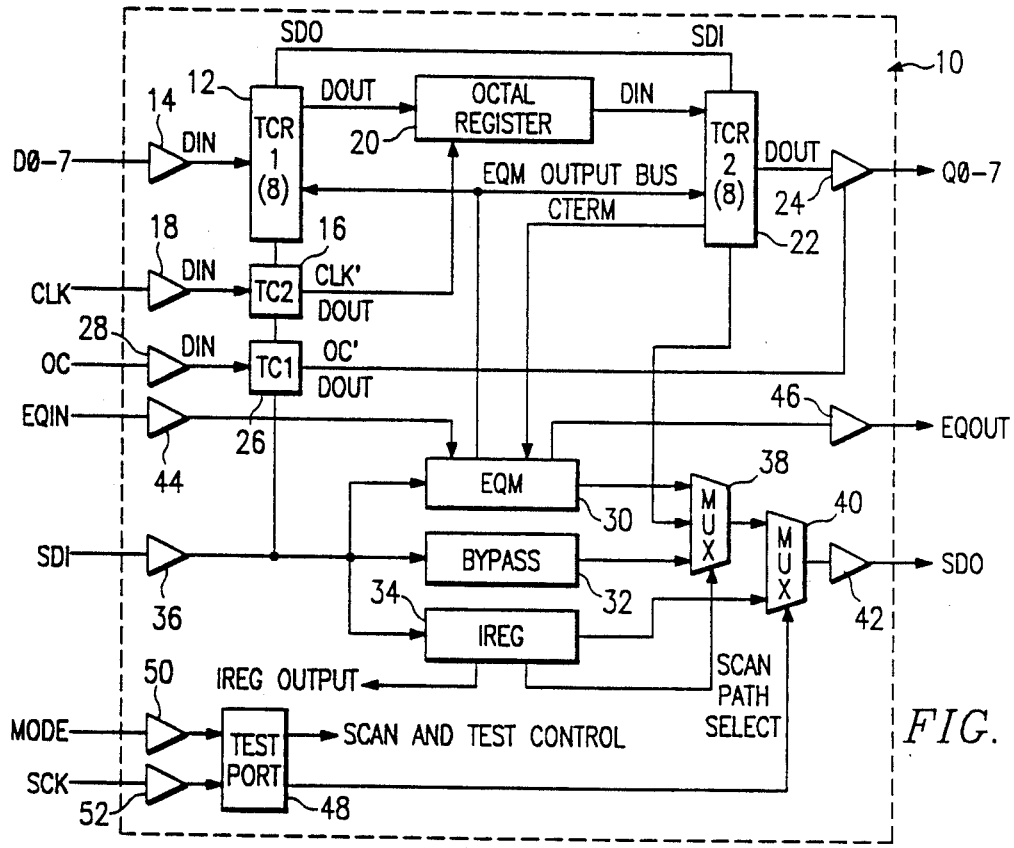
FIG. 1 illustrates a block diagram of an integrated circuit using the boundary test architecture of the present invention.

FIG. 1 illustrates a block diagram of an integrated circuit 10, for exemplary purposes shown as a register, incorporating the advanced boundary test architecture of the present invention. The integrated circuit 10 has the following inputs: data inputs (D0-7), data outputs (Q0-7), clock (CLK), output control (OC), event qualification in (EQIN), event qualification output (EQOUT), scan data in (SDI), scan data out (SDO), mode (MODE), and scan clock (SCK). The data inputs D0-7 are connected to an input test cell register (TCR1) 12 through a buffer 14. The CLK signal is input to a test cell (TC2) 16 through a buffer 18. The outputs of the input test cell register 12 and the test cell 16 are connected to the integrated circuit's internal logic, an octal register 20 in the illustrated embodiment. The test cell register 12 also has a serial data output (SDO) connected to a serial data input (SDI) of an output test cell register (TCR2) 22. The output of the octal register 20 is connected to the data inputs (DIN) of TCR2 22. The output of TCR2 22 is connected to the data outputs Q0-7 via a tristate buffer 24. The output control signal is connected to a test cell (TC1) 26 via buffer 28. The output (DOUT) of TC1 26 is connected to the tristate control of tristate buffer 24. The SDI signal is connected to TC1 26, and event qualifier module (EQM) 30, a bypass register 32, and an instruction register (IREG) 34, via a buffer 36. The scan data output of TC1 26 is connected to the scan data input of TC2 16. The scan data output of TC2 16 is connected to the scan data input of TCR1 12. The scan data outputs of TCR2 22, EQM 30, and the bypass register 32 are connected to a multiplexer 38. The output of the multiplexer 38 and the scan data output of IREG 34 is connected to a multiplexer 40. The output of the multiplexer 40 is connected to the SDO signal of the integrated circuit 10 via buffer 42.

The EQIN signal is input to the EQM 30 via buffer 44. EQM 30 also receives a CTERM signal output from TCR2 22. EQM 30 outputs a signal to TCR1 12 and TCR2 22 and supplies the EQOUT signal through buffer 46. The mode and SCK signals are connected to the test port 48 through buffers 50 and 52, respectively. The test port outputs a control signal to the multiplexer 40 and provides scan and test control signals to various components in the integrated circuit 10. The instruction register outputs control to the boundary scan path (TC1, TC2, TCR1 and TCR2), EQM 30, the bypass scan pass, and to multiplexer 38.

It should be noted, that for purposes of illustration, the integrated circuit 10 is depicted as an octal register. Although the octal register is selected as an example to illustrate the advanced boundary test architecture of the present invention, the present invention can be applied to any type of integrated circuit which has defined control inputs, internal application logic and/or memory, and inputs and outputs for data transfer. Examples of other components that could benefit from the advance boundary test architecture include counters, shift registers, FIFOs, Bit Slice Processors, RAM memories, microprocessors, and ASICs, among others. Further, the use of the present invention in a register could be modified to accommodate larger or smaller input and output buses as well as different control inputs which may differ from the example shown in FIG. 1, without departing from the nature of the invention.

In operation, data appearing on the D0-7 inputs is transferred to the Q0-7 outputs, via the octal register 20, when the CLK input is activated. When the OC input is activated, the output buffer 24 is placed in a high impedance output state. While the output buffer 24 is in a high impedance state, data can still be loaded into the octal register from the D0-7 inputs while the CLK is activated. While in normal mode, the test circuit registers (TCR1 12 and TCR2 22) do not inhibit the flow of input or output data.

The test structure illustrated in FIG. 1 comprises a test port 48 and four scan paths: an instruction register scan path, a boundary scan path, a bypass register scan path, and an EQM scan path. The boundary scan path comprises test cells for each control input (CLK and OC), TCR1 (which comprises a series of individual test circuits corresponding to each data input signal), and TCR2 (comprising a series of individual test circuits corresponding to each output signal).

The test cells used to construct the boundary scan path (TC1 26, TC2 16, TCR1 12 and TCR2 22) as well as the operation of the integrated circuit 10 in FIG. 1 during off-line boundary scan testing is described in U.S. Patent application Ser. No. 241,520 entitled "Integrated Test Circuit", U.S. Patent application Ser. No. 241,511, entitled "Enhanced Test Circuit", and U.S. Patent application Ser. No. 241,539, entitled "Testing Buffer/Register", all filed Sept. 7, 1988 by Whetsel, all of which are incorporated by reference herein.

Control Input Test Circuits

Figure 2:
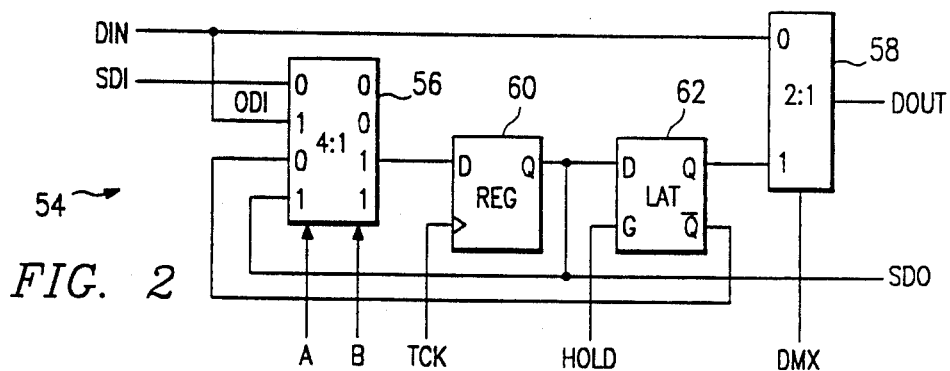
FIG. 2 illustrates a block diagram of the test cells used for clock and output control inputs in the present invention.

FIG. 2 illustrates a block diagram of the test cell 16 and 26 used for the CLK and OC control inputs. The test cell 54 comprises a 4:1 multiplexer 56 controlled by A and B control signals, a 2:1 multiplexer 58, a register 60 and a latch 62. The 4:1 multiplexer receives the DIN signal (from CLK or OC depending upon the test cell 26 or 16) through an ODI input, a SDI input, the output of the register 60, and the output of the latch 62. The output of the multiplexer 56 is connected to the register 60 which is connected to the test cell clock TCK. The output of the register 60 is connected to the latch 62 which is controlled by a HOLD signal and to an SDO signal. The output of the latch is connected to the 2:1 multiplexer 58 along with the DIN signal. The 2:1 multiplexer is controlled by a DMX signal. The output of the 2:1 multiplexer 58 is connected to the DOUT signal. The operation of this test cell is described in Tables 1-3. This test cell is described in detail in U.S. Patent application Ser. No. 241,520 referenced above.

During off-line boundary testing, wherein the integrated circuit 10 is not functional, TC1 26 and TC2 16 can observe the logic level applied to their DIN inputs and control the logic attached to their DOUT outputs. During on line boundary testing, wherein the integrated circuit 10 is operating normally, TC1 26 and TC2 16 allow the control inputs (CLK and OC) to pass freely through the test cells from the DIN input to the DOUT output.

TABLE I
TEST CELL REGISTER TRUTH TABLE

| A | B | TCK | OPERATION |
|---|---|---|---|
| 0 | 0 | / | Shift (SDI to SDO) |
| 1 | 0 | / | Load (ODI to SDO) |
| 0 | 1 | / | Toggle (SDO to SDO) |
| 1 | 1 | / | Idle (SDO to SDO) |

/ = rising edge of TCK signal

TALBE II
TEST CELL LATCH TRUTH TABLE

| HOLD | | OPERATION |
|---|---|---|
| 0 | Hold | (LQ = LQ) |
| 1 | Transfer | (SDO to LQ) |

TABLE III
TEST CELL 2:1 MUX TRUTH TABLE

| DMX | | OPERATION |
|---|---|---|
| 0 | Normal Mode | (DIN to DOUT) |
| 1 | Test Mode | (LQ to DOUT) |

Data Input Test Registers

The test circuit used for the data input signals is illustrated in FIG. 3 and in Tables 4 and 5. This test circuit is described in detail in U.S. Patent application Ser. No. 241,511, referenced above. This test circuit comprises a plurality of the test circuits 54 described in FIG. 2 in combination with parallel signature analysis (PSA) logic 64 and polynomial tap logic 65. The PSA circuitry 64 comprises two NAND gates 66 and 68 and an exclusive OR (XOR) gate 70. NAND gate 66 has inputs connected to the DIN signal and the DATMSK signal. NAND gate 68 has inputs connected to the SDI signal and the PSAENA signal. The outputs of NAND gates 66 and 68 are input to the XOR gate 70, the output of which is connected to the ODI input of the 4:1 multiplexer 56. Further, the polynomial tap circuitry 65 comprises a NAND gate 72 and an exclusive NOR gate (XNOR) 74. The NAND 72 has inputs connected to a PTAP signal and the output of the register 60. The output of the NAND gate 72 is connected to the input of the XNOR 74 along with an FBI signal. The output of the XNOR 74 is connected to an FBO signal.

TABLE IV
PARALLEL SIGNATURE ANALYSIS LOGIC TRUTH TABLE

| DATMSK | PSAENA | EXOR OUTPUT |
|---|---|---|
| 0 | 0 | ODI = "0" |
| 0 | 1 | ODI = SDI |
| 1 | 0 | ODI = DIN |
| 1 | 1 | ODI = SDI + DIN |

TABLE V
PROGRAMMABLE POLYNOMIAL FEEDBACK LOGIC TRUTH TABLE

| | INPUTS | | OUTPUT |
|---|---|---|---|
| PTAP | FBI | SDO | FBO |
| 0 | 0 | X | 0 |
| 0 | 1 | X | 1 |
| 1 | 0 | 0 | 0 |
| 1 | 0 | 1 | 1 |
| 1 | 1 | 0 | 1 |
| 1 | 1 | 1 | 0 |

During off-line boundary testing, externally applied control from the MODE and SCK inputs can cause the TCR1 12 to capture multiple D0-7 input patterns and compress the captured result into a signature, which can be shifted out for inspection. During the multiple capture operation, the PSA logic 64 is adjusted such that the exclusive OR result of the SDI and DIN inputs is loaded into the test cell via the observability data input (ODI), as illustrated in Table 4. During the single capture operation, the PSA logic 64 is adjusted such that only the DIN input is loaded into the test cell via the ODI input. The operation of the polynomial tap logic 65 is shown in Table 5. The polynomial tap logic 65 provides the feedback required for PSA test operations. These modes of operation of the integrated circuit 10 of FIG. 1 are described in U. S. Patent application Ser. No. 41,539, referenced above.

During on-line boundary testing, the internal EQM can issue control, via the EQM output bus, in response to a predetermined condition input to the EQM 30 via the Compare Term (CTERM) signal, causing TCR1 12 to capture multiple D0-7 data input patterns during normal CLK inputs. The multiple capture operation in TCR1 12 allows compressing a stream of D0-7 data input patterns into a signature. After the signature has been taken, external control can be input via the MODE and SCK inputs to shift the signature out for inspection.

It is important to note that TCR1 12 receives control from EQM 30, not from external MODE and SCK inputs to perform the single capture (data sample) and multiple capture (PSA) operations on the D0-7 data inputs. It is also important to note that the control issued from the EQM 30 to perform the single and multiple capture operations is synchronous with the CLK input.

Data Output Test Registers

FIG. 4 illustrates a block diagram of the test circuits comprising the TCR2 22 of the integrated circuit 10 shown in FIG. 1. The TCR2 22 comprises a plurality of test cells 54 shown in FIG. 2, each in combination with maskable comparator logic 76 and polynomial tap logic 77. The maskable comparator logic comprises an XOR gate 78 connected to an EXPDAT signal and the DIN signal. The output of the XOR gate 78 is connected to the input of an NAND 80, along with the CMPMSK signal. The output of the NAND gate 80 is connected to the CMPOUT signal. NAND gate 82 of the polynomial tap logic 77 is connected to the output of the register 60 and to a PTAP signal. The output of the NAND gate 82 is connected to an XNOR gate 84 along with an FBI signal. The output of the XNOR gate 84 is connected to the FBO signal. The operation of the maskable comparator logic is shown in Table 6. The operation of the TCR2 22 is described in detailed in U.S. Patent application Ser. No. 241,511, referenced above.

TABLE VI

MASKABLE COMPARATOR LOGIC TRUTH TABLE

| INPUT | | | OUTPUT |
|---|---|---|---|
| CMPMSK | EXPDAT | DIN | CMPOUT |
| 0 | X | X | 1 |
| 1 | 0 | 0 | 1 |
| 1 | 1 | 0 | 0 |
| 1 | 0 | 1 | 0 |
| 1 | 1 | 1 | 1 |

During off-line boundary testing, externally applied control from the MODE and SCK inputs can shift test data into TCR2 22 and cause the test data to be applied from the DOUT outputs of the test circuits in TCR2 22. This mode of operation is described in U.S. Patent application Ser. No. 241,539, referenced above.

During on-line boundary testing, externally applied control from the MODE and SCK inputs can be used to shift test data into the test circuits of TCR2 22. Once the test data has been installed, the EQM 30 is enabled by a control input from the IREG 34 to issue control via the EQM output bus in response to a predetermined condition input to the EQM from TCR2 22 via the CTERM signal, causing the DMX input to the 2:1 multiplexer 58 of the test cells in TCR2 22 to switch and output the test pattern onto the Q0-7 outputs during a normal CLK input. The CTERM output from TCR2 22 is the result of a logical AND operation of all the CMPOUT outputs from each test circuit 54 in TCR2 22. The eight CMPOUTs from the eight test circuits in TCR2 22 are input to an eight input AND gate residing in TCR2 22. The output from the AND gate is the CTERM signal shown in FIG. 1. When all the CMPOUT outputs from the test circuits in TCR2 22 are high, the CTERM output is high, indicating to the EQM 30 the presence of an expected condition on the Q0-7 data output bus. When one or more of the CMPOUT outputs from the test circuits 54 of TCR2 22 is low, the CTERM output is low, indicating to the EQM 30 the absence of an expected condition on the Q0-7 data output bus.

The maskable comparator logic 76 of the test circuits of TCR2 22 is used to compare the Q0-7 outputs from the octal register 20 against a predetermined expected data (EXPDAT) pattern input to TCR2 22 from the EQM 30 via the EQM output bus. When a match is found between the EXPDAT pattern and the output from the octal register (CTERM=1), the EQM 30 can issue control to TCR1 12 or TCR2 22, via the EQM output bus to perform the desired on-line test operation. If required, one or more of the test circuit s maskable comparator logic in TCR2 22 can be masked off if matching is not required on some of the signals on the Q0-7 data output bus. To mask off a compare operation, a predetermined compare mask (CMPMSK) pattern is input to the test circuits in TCR2 22 via the EQM output bus. The maskable comparator logic truth table in Table 6 illustrates that the maskable comparator logic outputs a true match condition (DIN=EXPDAT) on the CMPOUT output if the CMPMSK input is set low. While the CMPMSK input to a maskable comparator logic is set low, its CMPOUT output is high regardless of the relationship between DIN and EXPDAT. While high, the CMPOUT input has no effect on the AND gate inside TCR2 22.

It should be noted that TCR2 22 receives control from the EQM 30 and not from the external MODE and SCK inputs to insert test data onto the outputs Q0-7 during normal operation. It is also important to note that the control issued from the EQM 30 to perform the on-line test data insertion operation is synchronous with the CLK input.

As described in connection with FIGS. 3 and 4, the EQM 30, in combination with the maskable comparator logic in the test circuits of TCR2 22, provides a method of activating a test in response to a condition occurring inside the integrated circuit 10 of FIG. 1. In some on-line testing applications, it may be necessary not only to know when a condition has occurred internal to the integrated circuit 10, but also when other conditions in other integrated circuits in the circuit have occurred. To allow for expanding the event qualification capability of the advanced boundary test structure so that multiple integrated circuits can participate in qualifying an on-line test operation, the EQM requires the use of an external input signal (Event Qualifier Input, "EQIN") and an external output signal (Event Qualifier Output, "EQOUT"), as shown in FIG. 1.

Expanded Event Qualification

Figure 5:
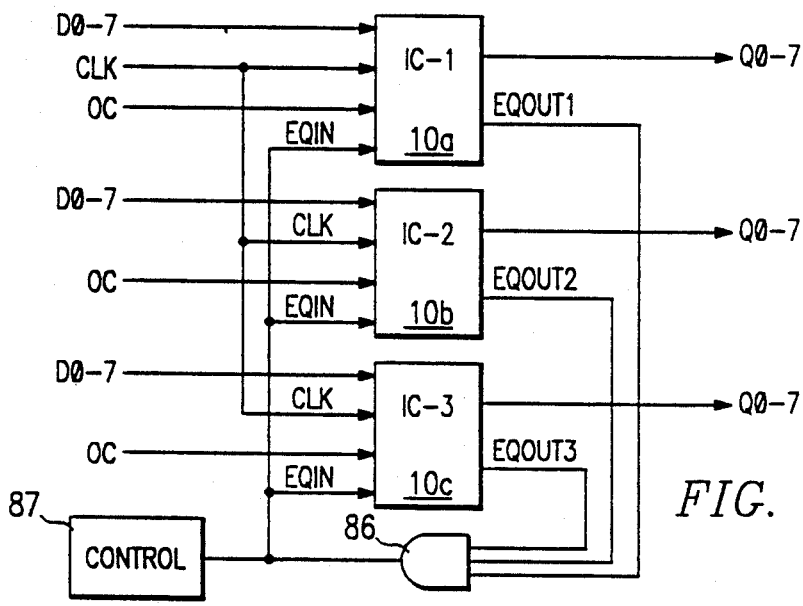
FIG. 5 illustrates a block diagram showing several integrated circuits having the advanced boundary test architecture connected to provide expanded event qualification capabilities.

A circuit networking a plurality of integrated circuits is shown in FIG. 5. The EQOUT signals from three integrated circuits 10a–c are input to an AND gate 86. The output of the AND gate 86 is connected to the EQIN signal of each integrated circuit 10a–c and to a controller chip 87. The benefit of using an AND gate rather than using a wired-OR configuration in the external feedback network is an increase in speed. A logic gate (AND gate) with an active output typically switches from a low to high output (EQIN) in nanoseconds, where as a wired-OR (open collector output) configuration switches from a low to high output in milliseconds. During at-speed testing, it is critical that the response time between an EQOUT input to the AND gate and the resulting EQIN output from the AND gate be as fast as possible.

In FIG. 5, three integrated circuits are shown forming a circuit. Each integrated circuit in FIG. 5 has the same internal architecture as the integrated circuit in FIG. 1. The EQM 30 of each integrated circuit 10a–c can be configured such that the internal CTERM from each integrated circuit's TCR2 22 is output from the EQM 30 via the EQOUT output signal. Also, each integrated circuit's EQM 30 can be configured such that an on-line test operation can be activated in response to an EQIN input rather than the internal CTERM input.

To qualify an on-line test operation based on the conditions occurring in the three integrated circuits in FIG. 5, each integrated circuit's EQM 30 outputs an EXPDAT pattern to the TCR2s 22 of each integrated circuit 10a–c. When the Q0-7 data output of each integrated circuit 10a–c matches the EXPDAT pattern, the EQOUT output is set high. Since the EQOUT outputs are all input to the external AND gate 86, the EQIN output from the AND gate 86 is only high when all EQOUT inputs are high. When a match is found in all three integrated circuits 10a–c, the EQOUT inputs to the external AND gate are all high; thus, the EQIN output from the AND gate 86 is high. The EQMs 30 of each integrated circuit 10a–c may respond to the high logic input on the EQIN input to perform an on-line test operation. If one or more of the integrated circuits 10a–c in FIG. 5 does not participate in the event qualification process, its EQOUT output may be set high so that it has no effect on the external AND gate. Although an AND gate is shown in this description to detect the occurrence of all "1", an OR gate could be used in a similar manner if detecting all "0" is preferred, without departing from the nature of the invention.

The controller chip 87 monitors the testing of the integrated circuit and controls the data shifted into and out of the scan path. When the controller chip detects a signal indicating that the test is over, it may shift data out of the integrated circuits for further analysis.

Although the illustration of expanded event qualification is shown in regard to integrated circuits in a circuit, the same event qualification network is hierarchical in nature; the event qualification network may be applied to any level of integration such as subcircuits in an integrated circuit, boards in a box, boxes in a subsystem, or subsystems in a system.

Event Qualification Module

Figure 6:
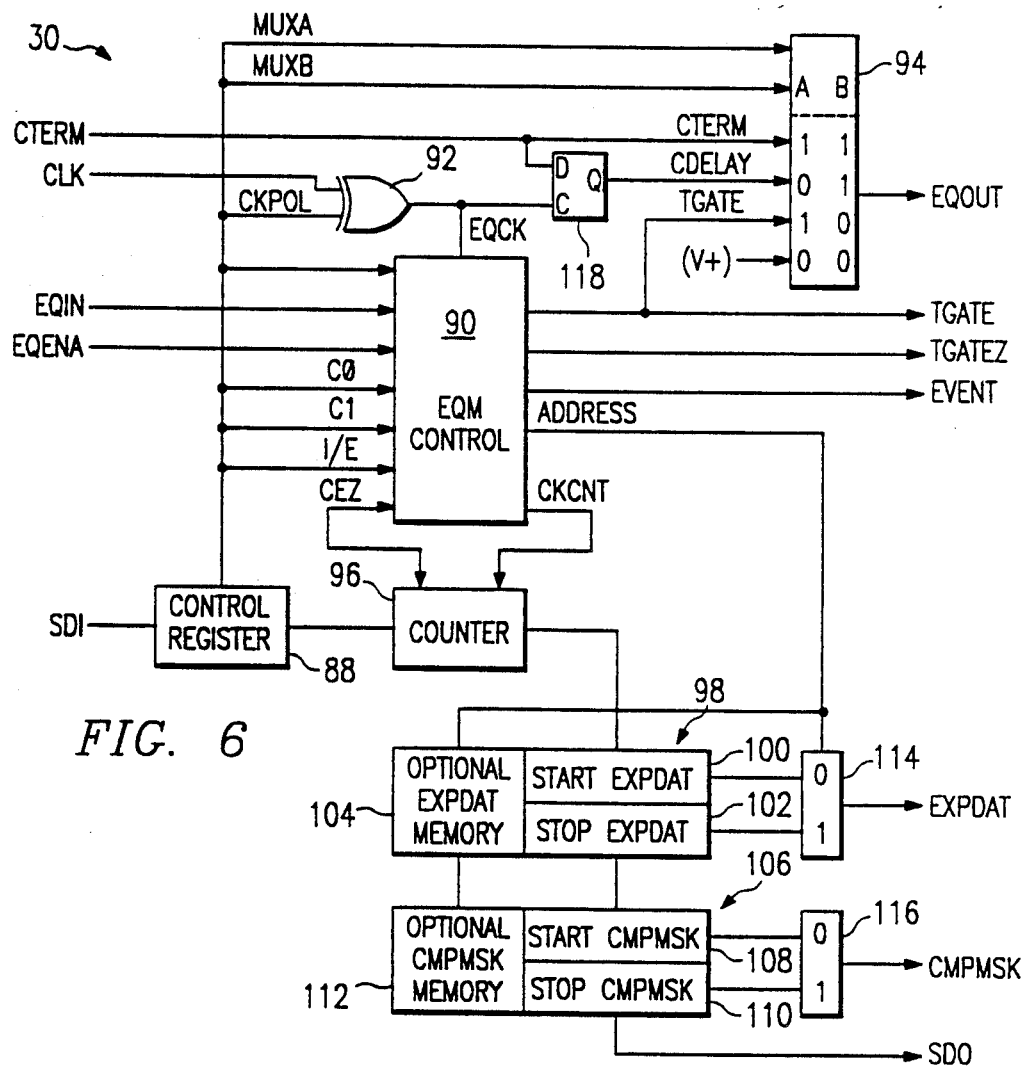
FIG. 6 illustrates a block diagram of the event qualification module used in the present invention.

FIG. 6 illustrates a block diagram of the event qualification module 30. The event qualification module 30 receives the following inputs: CTERM (from TCR2 22), CLK, EQIN and SDI (input to integrated circuit 10), and EQENA from the IREG 34. The EQM 30 has seven outputs: EQOUT, TGATE, TGATEZ, EVENT, EXPDAT, CMPMSK and SDO. The SDI signal is input to a control register 88. The control register 88 outputs signals C0, C1 and I/E to an EQM controller 90, a CKPOL signal to an XOR gate 92 and MUXA and MUXB signals to a 4:1 multiplexer 94. The XOR gate 92 also receives the CLK signal. The EQM controller 90 receives the CTERM signal, and the EQIN and EQENA signals. The control register 88 is also connected to a counter 96 which outputs a CEZ signal to the EQM controller 90. The counter 96 is connected to a start and stop expected data section 98 having a start expected data register 100, a stop expected data register 102 and an optional expected data memory 104. The start and stop expected data section 98 is connected to a start and stop compare mask section 106 having a start compare mask register 108, a stop compare mask register 110 and an optional compare mask memory 112. The start expected data register 100 and stop expected data register 102 are connected to a multiplexer 114, which outputs the signal EXPDAT. The start compare mask register 108 and stop compare mask register 110 are connected to a multiplexer 116 which outputs a signal CMPMSK. The start and stop compare mask section 106 also outputs the SDO signal. The multiplexers 114 and 116 are controlled by an ADDRESS signal from the EQM controller 90. The EQM controller 90 also outputs a CKCNT signal to the counter 96.

The CTERM signal is input to a D Flip Flop 118 which is clocked by the EQCK signal output from the XOR gate 92. The EQCK signal is also input to the EQM controller 90. The output of the D Flip Flop 118 is connected to the multiplexer 94 along with the TGATE signal from the EQM controller and a V+ signal, which is tied to a high logic source. The output of multiplexer 94 is the EQOUT signal. The TGATE, TGATEZ, and EVENT signals are output from the EQM controller 90.

The 4:1 multiplexer has six inputs: MUXA, MUXB, CTERM, CDELAY, TGATE and V+ and one output EQOUT. The MUXA and MUXB inputs from the EQM control register 88 can be programmed, via a scan operation, to select any input (CTERM, CDELAY, TGATE, V+) to be output on EQOUT. The V+ input is tied to a high logic source and is selected to be output from the 4:1 multiplexer when the EQOUT output is to be set to a static high logic level.

The CTERM signal is selected to be output from the 4:1 multiplexer 94 when the EQOUT signal is required to output the asynchronous (non-registered) result of the internal compare operation in TCR2 22 between the EXPDAT and the Q0-7 data output from the octal register 20. The CDELAY (delayed CTERM) signal is selected to be output from the 4:1 multiplexer 94 when it is required to output a CTERM which is delayed and synchronized by the integrated circuit's CLK input. The TGATE signal from the EQM controller 90 is selected to be output from the 4:1 multiplexer 94, when it is required to track the progress of an internally qualified test operation.

The clock input to D flip flop 118 is received from the output of the XOR gate 92 (EQCK). The purpose of the D flip flop 118 is to provide a method of synchronizing the CTERM input with the integrated circuit's CLK input such that a delayed CTERM (CDELAY) can be output on EQOUT.

By selecting the CDELAY output to drive the EQOUT output from the 4:1 multiplexer 94, the EQM 30 can delay the EQOUT output by one integrated circuit CLK cycle. This delay is sometimes necessary in order to perform event qualification in high speed circuits because it allows the EQOUT output to be valid immediately after the CLK edge. Without the delay, the EQOUT output would be delayed by the amount of time it takes the maskable comparator logic in the test circuits of TCR2 22 to compare the EXPDAT to the Q0-7 data outputs and output the CTERM signal.

The XOR gate 92 is used to select which edge of the integrated circuit's CLK input activates the EQM controller 90 and D flip flop 118. The CKPOL input from the EQM control register 88 can be set, via a scan operation, to select the CLK's rising edge (CKPOL=0) or falling edge (CKPOL=1). It is sometimes necessary to select either the rising or falling edge of the CLK in order to achieve the timing required for an on-line test operation.

EQM Controller

A block diagram of the EQM controller 90 is shown in FIG. 7. The EQM controller 90 is a state machine that has seven inputs (CTERM, EQIN, EQENA, C0, C1, I/E and CEZ), and five outputs (TGATE, TGATEZ, EVENT, ADDRESS and CKCNT). The EQM controller 90 comprises a state register 120 and a combinational logic section 122. The EQM controller 90 operates from the host integrated circuit's function clock. The combinational logic section 122 receives the CEZ, C0 and C1 signals. The I/E signal selects either the EQIN or CTERM signal for output from the 2:1 multiplexer 124 to the logic section 122. The EQENA signal is synchronized with the EQCK signal through synchronizer 126 and input to the logic section 122. A feedback signal is connected from the register 120 to the logic section 122. The register 122 outputs TGATE and ADDRESS signals; an inverter connected to the TGATE signal provides TGATEZ. The EQCK signal is connected to the register 120 and to an inverter 130. The output of the inverter is connected to an AND gate 132 along with an output from register 120 to provide the CKCNT signal. As shown in FIG. 1, the EQM 30 uses the integrated circuit's CLK input; thus, it is synchronous in operation with the octal register 20 in FIG. 1.

Controller Inputs

The CTERM input is an internal condition input which is monitored by the EQM controller 90 when on-line testing decisions are based on the occurrence of an internal event. In the integrated circuit of FIG. 1, the internal event would be a match occurring in TCR2 22 between the EXPDAT input from the EQM output bus and the Q0-7 data output from the octal register 20.

The EQIN input is an external condition input which is monitored by the EQM controller 90 when on-line testing decisions are based on the occurrence of an external event. In FIG. 5, the external event would be a match occurring at all three EQOUT outputs of integrated circuits 1, 2 and 3.

The I/E (Internal/External) input comes from a scannable bit in the EQM control register 88. The purpose of the I/E input is to control the 2:1 multiplexer 124 to select either the internal CTERM input (I/E=1) or the external EQIN input (I/E=0) to be coupled to the output (EVENT) of the multiplexer 124. The EVENT output from the 2:1 multiplexer 124 is monitored by the EQM controller 90 to perform an event qualification operation described below.

The C0 and C1 inputs come from two scannable bits in the EQM control register 88. C0 and C1 provide the required two-bit command input for the EQM controller to perform one of four event qualification operations described below.

The EQENA (EQM enable) input comes from the IREG 34 via the IREG output bus and is used to enable the EQM controller 90 to perform the event qualification operation set up by the C0 and C1 command bits. The EQENA is clocked through a synchronizer circuit 126 by the EQCK output from the XOR gate 92. The synchronizer circuit 126 synchronizes the EQENA input with EQCK driving the state machine. The output of the synchronizer 126 is input to the state machine register 120. If the synchronizer output is low, the state machine is disabled. If the synchronizer output is high, the state machine is enabled to execute the two-bit command input on C0 and C1.

The CEZ (Count Equal Zero) input comes from a counter that resides in the EQM control register 88. The CEZ signal is input to the EQM controller 90 to indicate when the counter 96 has reached a count of zero.

The counter 96 allows event qualification operations to be repeated for a programmable number of times. If the CEZ input is high at the end of an event qualification operation, the EQM controller 90 will repeat the operation. If the CEZ input is low at the end of an event qualification operation, the EQM controller 90 will go to the end of test state.

Controller Outputs

The TGATE output from the EQM controller 90 goes high on the rising edge of the EQCK output from the XOR gate 92 when a condition occurs on the EVENT input to the EQM controller 90. The TGATE output may remain high for one or more EQCK cycles, depending upon the command input to the EQM controller 90 on the C0 and C1 inputs. The high active TGATE output can be used to initiate a test in response to a condition.

In the integrated circuit of FIG. 1, TGATE is input to TCR2 22, via the EQM output bus, and is used to cause the test circuits 54 in TCR2 22 to output test data onto the Q0-7 data output bus during a qualified CLK cycle. This operation is referred to as "Dynamic Test Data Insertion" and is exemplified in the EQM protocols of FIGS. 12-15 and TCR2 22 interconnect diagram in FIG. 8.

Figure 8:
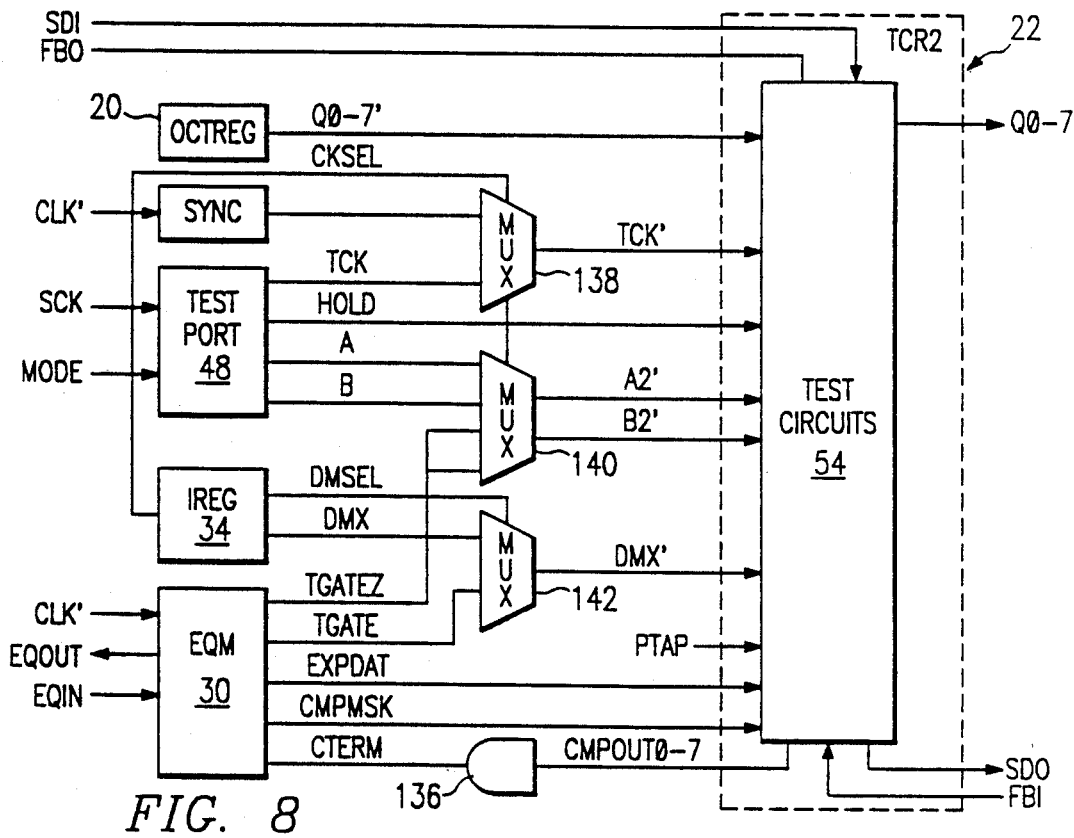
FIG. 8 illustrates a block diagram of the inputs to the output test circuit of the present invention.

Referring to FIG. 8, which is described in detail herein below, the Dynamic Test Data Insertion operation allows a predetermined test pattern that had previously been shifted into TCR2 22 to be output from the Q0-7 data outputs in response to an expected condition. The test data is inserted in place of the normal data from the octal register that would otherwise be output from the IC of FIG. 1. This test data insertion test operation can occur without disturbing the normal operation of the IC. If so desired, test data could also be inserted in a similar fashion from the test circuit outputs of TCR1 12 of FIG. 1.

In FIGS. 12-15, the four different protocols of the EQM that can be used to insert test data are shown. IN each protocol the test data is inserted onto the Q0-7 data outputs while the TGATE signal is high. A detailed description of the protocols and their effect on the circuit of FIG. 8 is given below.

If the Dynamic Test Data Insertion is qualified internally by the CTERM input to the EQM controller 90, the CTERM input should be selected and output on the EQOUT output so that external test equipment can track the progress of the internally qualified test operation.

The TGATEZ output is an inverted TGATE output. The TGATEZ goes low on the rising edge of the EQCK cycles, depending upon the command input to the EQM controller 90 on the C0 and C1 inputs. The low active TGATEZ output can be used to initiate a test in response to a condition.

In the IC of FIG. 1, TGATEZ is input to TCR1 12, via the EQM output bus, and is used to cause the test circuits in TCR1 12 to load the data on the D0-7 data inputs during one or more qualified CLK inputs. If only one D0-7 data input pattern is loaded into the test circuits of TCR1 12, the test is referred to as a "Dynamic Data Sample" operation and is exemplified in the EQM protocol of FIG. 16 and TCR1 12 interconnect diagram in FIG. 9.

Figure 9:
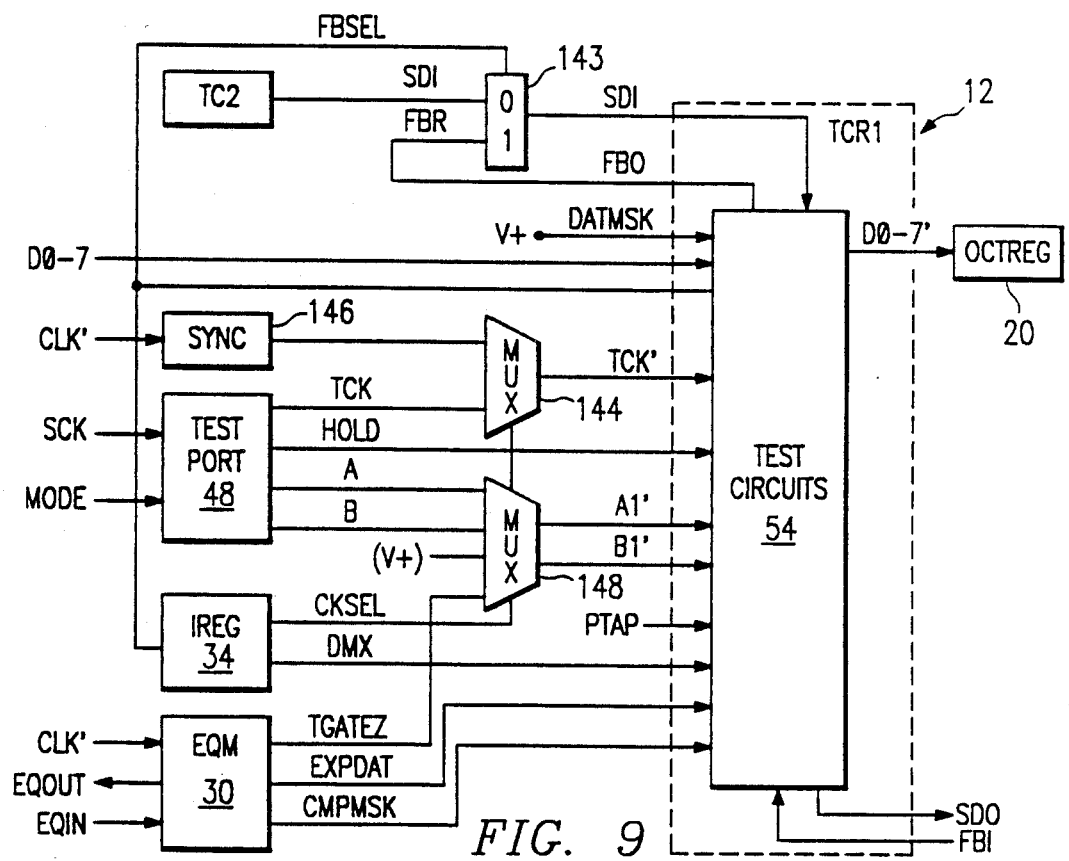
FIG. 9 illustrates a block diagram of the interconnects to the input test circuit of the present invention.

Referring to FIG. 9, described in detail herein below, the Dynamic Data Sample operation allows a data pattern entering the IC of FIG. 1, via the D0-7 data input bus, to be sampled by TCR1 12 in response to an expected condition. Once sampled, external input from the MODE and SCK can shift out the sampled data for inspection. These test operations (sample and shift) can occur without disturbing the normal operation of the IC 10. If so desired the data being output from the IC in FIG. 1 could also be sampled in a similar fashion by the test circuits in TCR2 22.

Referring to FIG. 16, the EQM protocol used to sample data is shown. In the protocol data is sampled by TCR1 while TGATEZ is low and on the rising edge of the CLK input. A detailed description of this protocol and its effect on the circuit of FIG. 9 is given below.

If multiple D0-7 data input patterns are sampled into the test circuits of TCR1, the test is referred to as a "Dynamic PSA" operation and is exemplified in the EQM protocols of FIGS. 17-19 and TCR1 12 interconnect in FIG. 9.

In FIG. 9, described in detail herein below, the Dynamic PSA operation allows multiple data patterns, entering the IC of FIG. 1 via the D0-7 data input bus, to be sampled by TCR1 12 and compressed into a signature. The PSA operation is initiated in response to an expected start condition, and is terminated in response to an expected stop condition, as determined by the command inputs on C0 and C1. After the PSA operation is complete, external input from the MODE and SCK can shift out the signature for inspection. These test operations (PSA and shift) can occur without disturbing the normal operation of the IC 10.

In FIGS. 17-19, the EQM protocols used to perform Dynamic PSA operations are shown. In the protocols, the data is sampled in TCR1 12 while the TGATEZ is low and on the rising edge of each CLK input. A detailed description of these protocols and their effect on the circuit of FIG. 9 is given below.

If a Dynamic Data Sample or Dynamic PSA test operation is qualified internally by the CTERM input to the EQM controller 90, the CTERM input should be selected and output on the EQOUT output so that external test equipment can track the progress of the internally qualified test operation.

If any Dynamic test operation (Insert, Sample, PSA) is qualified externally by the EQIN input to the EQM controller, either the CTERM, CDELAY, or V+ signal should be selected and output on the EQOUT output. CTERM should be output when the IC 10 is required to output the CTERM compare result from TCR2 22. CDELAY is output when the IC 10 is required to output a delayed CTERM output. V+ is output on EQOUT when the IC 10 is not participating in an external event qualification operation.

The EVENT output signal is an asynchronous (non-registered) EQM output reflecting the present condition (comparison result) of either the external EQIN or internal CTERM input. The selection of which signal (EQIN or CTERM) is coupled to EVENT is determined by the I/E input from the control register 88. The EVENT signal may be used by external interface logic inside the IC for implementing additional test control functions.

The ADDRESS output signal provides selection between a first (START) EXPDAT pattern and a second (STOP) EXPDAT pattern. When an event qualification operation is being performed the EQM Controller 90 will output a low logic level on the ADDRESS output to select the Start EXPDAT pattern to be input to the test circuits of TCR2 22, via the EQM output bus.

After a match is found between the Start EXPDAT pattern and the Q0-7 data outputs from the octal register 20, the EQM Controller 90 will output a high logic level on the ADDRESS output to select the Stop EXPDAT pattern to be input to the test circuits of TCR2 22.

After a match is found between the Stop EXPDAT pattern and the Q0-7 data outputs from the octal register 20, the EQM Controller 90 may repeat the start and stop addressing sequence on another set of first (START) and second (STOP) EXPDAT patterns or go to the end of test state.

If the counter 96 in the EQM scan path has decremented to a count of zero (CEZ=1), the EQM controller 90 will go to the end of test state after the event qualification operation is complete. If the counter 96 has not decremented to a count of zero (CEZ=0), the EQM controller 90 will repeat the event qualification operation until the counter has decremented to zero.

The ADDRESS output also controls the selection of the Start and Stop CMPMSK patterns to the test circuits of TCR2 22 in the exact same manner as described for the Start and Stop EXPDAT patterns.

The ADDRESS signal from the EQM 30 is input to the Optional EXPDAT and CMPMSK memories 104 and 112 of FIG. 6. The ADDRESS signal is used to access additional EXPDAT and CMPMSK patterns from the Optional EXPDAT and CMPMSK memories and to load these patterns into the EXPDAT and CMPMSK registers. The memories will address and output the next EXPDAT and CMPMSK patterns on the low to high transition of the ADDRESS signal. The patterns output from the memories are loaded into the EXPDAT and CMPMSK registers on the high to low transition of the ADDRESS signal. In this way a new set of Start and Stop EXPDAT and CMPMSK patterns are available for subsequent start and stop event qualification operations.

The CKCNT (Clock Counter) output signal from the EQM Controller 90 is a strobe output that is used to decrement the counter 96 in the EQM Scan Path. The high active CKCNT output strobe occurs on the falling edge of EQCK.

Scan Path

In FIG. 6, it is seen that a scan path exists in the EQM 30. External control can be input on the MODE and SCK inputs to cause data to be shifted through the EQM scan path. The scan path is partitioned into three sections; EQM Control Register 88, EQM Counter 96, and Start and Stop EXPDAT and CMPMSK data sections 98 and 106, respectively.

The EQM Control Register 88 contains the command and configuration bits required for the EQM 30 to perform its event qualification functions. The EQM Control Register 88 will be set up before the EQENA input from the IREG 34 enables the EQM Controller 90. Once the EQENA input is set high, the EQM controller 90 responds to the two-bit command (C0 and C1) in the control register to perform a test operation.

The EQM Counter 96 can be loaded during a scan operation to allow an event qualification operation to be repeated for the number loaded into the counter. The EQM Counter 96 is decremented by the CKCNT output from the EQM controller 90 at the beginning of every event qualification operation. When the counter decrements to zero value it will output a Count Equal Zero (CEZ) to the EQM controller 90 to cause it to stop repeating the event qualification operation and enter into the End of Test state.

The Start/Stop EXPDAT and CMPMSK sections 98 and 106 in the scan path contain the patterns input to the test circuits of TCR2 22 via the EQM Output bus. In FIG. 6, only one register is shown for each pattern (Start EXPDAT, Stop EXPDAT, Start CMPMSK, Stop CMPMSK), however multiple sets of Start/Stop EXPDAT and CMPMSK data patterns can be stored in optional memories 104 and 112 behind the EQM scan path to allow the EQM 30 to repeat a START and STOP sequence with multiple sets of EXPDAT and CMPMSK data patterns. If desired, the TCR1 12 can also comprise similar Start/Stop EXPDAT and CMPMSK sections in order to compare input data, similar to the way that TCR2 22 compares output data.

During normal operation, the IC 10 of FIG. 1 functions as a standard octal register with eight data inputs (D0-7), eight data outputs (Q0-7), a clock input (CLK), and a tristate output control input (OC). The data appearing at the D0-7 inputs is loaded into the octal register 20 and applied from the Q0-7 outputs when a CLK input is applied. If the OC input is activated, the Q0-7 output buffers 24 are placed in a tristate condition. While the outputs are tristate, the CLK input can still load the data appearing on the D0-7 input into the octal register 20.

While the IC 10 is operating, the external MODE and SCK inputs can shift data through the IREG 34 or a selected data register (boundary scan path [TC1, TC2, TCR1, TCR2], EQM scan path, or Bypass scan path) from the SDI input to the SDO output. By being able to shift data into the device during normal operation, online test instructions can be installed and performed in the background without interfering with the functioning IC 10.

Detailed Circuit of Output Test Register

In FIG. 8, a detailed view of the interconnects to TCR2 22 is shown. A serial data path enters TCR2 22 via the SDI input, passes through each test circuit 54 and is output from TCR2 22 via the SDO output. This serial data path allows loading and unloading of the test circuits 54 of TCR2 22. A feedback input (FBI), tied to a logic low, enters TCR2 22, passes through each test circuit's polynomial feedback circuitry (see FIG. 4), and is output from TCR2 22 via the feedback output (FBO). The feedback path is required during PSA operations.

During normal operation, output data (Q0-7,) from the octal register 20 enters TCR2 22, passes through the test circuits and is output from TCR2 22 and the IC 10 on the Q0-7 data outputs.

Control for the eight test circuits 54 of TCR2 22 is input on the TCK' HOLD, B2', A2', DMX', EXPDAT, PTAP and CMPMSK inputs. The HOLD input comes directly from the test port 48. The EXPDAT and CMPMSK inputs come directly from the EQM 30. The PTAP inputs are wired high or low to set the desired feedback polynomial. The CTERM output from TCR2 22 comes from the output of an AND gate 136. The eight CMPOUT outputs from the eight test circuits in TCR2 22 are input to the AND gate 136. The CTERM output is input to the EQM 30 and is set high when a match occurs between the Q0-7, data inputs and the EXPDAT inputs from the EQM 30. If desired, similar comparing circuitry and related input and output could be implemented in TCR1 12 to allow event qualification on incoming data D0-7.

The TCK' input comes from a multiplexer 138 that selects either the TCK output from the test port or the IC's CLK' input from the output of TC2 16 to be coupled to TCK'. The selection of which input is coupled to TCK' is determined by the CKSEL output, from IREG 134. During Dynamic PSA testing the CLK' input is coupled to TCK, so that the test circuits of TCR2 22 are synchronized to the operation of the IC 10. During off-line testing, or during scan operations the TCK output from the test port 48 is coupled to TCK' so that the test circuits 54 are synchronized to the external scan clock.

The A2' and B2' inputs come from a multiplexer 140 that selects either the TGATEZ output, from the EQM 30 or the A and B outputs from the test port 48 to drive the A2' and B2' signals. The selection of which input is coupled to A2' and B2' is determined by the CKSEL output, from the IREG 34. During dynamic PSA testing, the TGATEZ output drives both A2' and B2' so that they can be controlled by the EQM 30. During off-line testing, A drives A2' and B drives B2' so that they can be controlled by the test port 48 during off line testing and scanning operations.

The DMX' input comes from a multiplexer 142 that selects either the DMX output from the IREG 34 or the TGATE output from the EQM 30 to be coupled to DMX'. The selection of which input is coupled to DMX' is determined by the DMSEL output from the IREG 34. During dynamic test data insertion the TGATE output from the EQM 30 is coupled to DMX' so that it can be controlled by the EQM 30. During off-line testing or during scan operations the DMX output from the IREG 34 is coupled to DMX' so that it can be controlled by the test port 48.

Detailed Circuit of Input Test Register

In FIG. 9, a detailed view of the interconnects to TCR1 12 is shown. A serial data path enters TCR1 12 via the SDI input, passes through each test circuit 54 and is output from TCR1 12 via the SDO output. This serial data path allows loading and unloading of the test circuits of TCR1 12. A feedback input (FBI) enters TCR1 12, passes through each test circuit's polynomial feedback circuitry (see FIG. 3), and is output from TCR1 12 via the feedback output (FBO). The feedback path is required during PSA operations.

Figure 10:
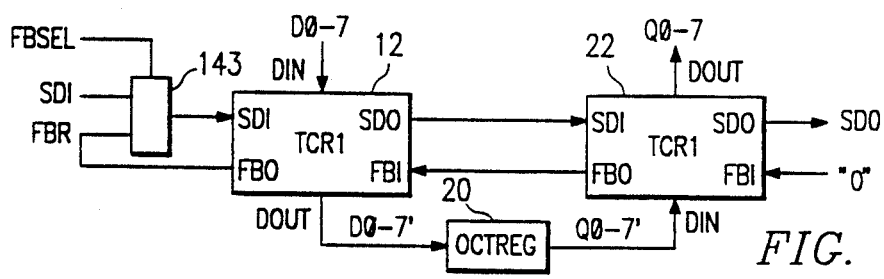
FIG. 10 illustrates the configuration of the input and output test circuit registers during PSA test operations.

The FBO is referred to in FIG. 9 as a feedback result (FBR) since it represents the exclusive OR of several test circuits in TCR1 12 and TCR2 22. In FIG. 10, the total feedback path from TCR2 22 to TCR1 12 is shown. The FBR signal is input to a multiplexer 143 along with the SDI input from TC2. The feedback select (FBSEL) signal from the instruction register selects which multiplexer input is coupled to the SDI input of TCR1 12. During on-line dynamic PSA testing the FBR input is coupled to SDI. During off-line testing or during scan operations the SDI input from TC2 is coupled to the SDI input of TCR1 12.

During normal operation, input data (D0-7') enters TCR1 12, passes through the test circuits 54 and is output from TCR1 12 to the octal register inputs (D0-7').

Referring again to FIG. 9, control for the eight test circuits of TCR1 12 (FIG. 9) is input on the TCK', HOLD, B1', A1', DMX, EXPDAT, CMPMSK, PTAP, DATMSK and PSAENA inputs. The HOLD input comes directly from the test port 48. The EXPDAT and CMPMSK inputs come directly from the EQM 30. The DMX and PSAENA inputs come directly from the IREG 34. The DATMSK inputs are tied to a high logic level. The PTAP inputs are wired high or low to set the desired feedback polynomial.

The TCK' input comes from a multiplexer 144 that selects either the TCK output from the test port 48 or the IC's CLK' input from the output of TC1 12 in FIG. 1 to be coupled to TCK'. The selection of which input is coupled to TCK' is determined by the CKSEL output from the IREG. During dynamic PSA testing the CLK, input is coupled to TCK' through synchronizer 146 so that the test circuits 54 of TCR1 12 are synchronized to the operation of the IC 10. During off-line testing or, during scan operations, the TCK output from the test port 48 is coupled to TCK' so that the test circuits 54 are synchronized to the external scan clock.

The A1' and B1' inputs come from multiplexer 148. The multiplexer 148 is controlled by the CKSEL output from the IREG 134. During dynamic PSA operations the multiplexer 148 couples the A1' input to a high logic level and the B1' input to the TGATEZ output from the EQM 30. In this configuration the A1' input is fixed high and the B1' input can be controlled by the EQM 30. During off-line testing, A drives A1' and B drives B1' so that they can be controlled by the test port 48 during off-line testing and scanning operations.

Event Qualification Protocols

In order for the event qualification concept to operate in an orderly fashion, a set of standard protocols has been defined. FIGS. 11a-e illustrate a set of event qualification protocols that allow interoperability between the EQMs 30 of multiple ICs in a circuit. These event qualification protocols provide the timing and control required to perform the types of on-line tests described in this disclosure. By adhering to a set of standard event qualification protocols, all IC designs will be capable of operating together to perform advanced test operations in response to a condition.

FIG. 11a illustrates a flow chart showing the operation of the EVENT command interpreter of the EQM controller 90. Initially, as shown in block 150, the controller is in an IDLE state. The controller monitors the EQENA signal; as long as EQENA equals zero, the controller remains in an IDLE state. When EQENA equals one, the EVENT command interpreter will exit the IDLE state and enter a protocol as shown in block 152. The protocol entered by the EVENT command interpreter will depend upon the values of the C0 and C1 control signals. If C0 equals zero and C1 equals zero, then Protocol-1 is entered as shown in block 154. If C0 equals one and C1 equals zero, then Protocol-2 entered as shown in block 156. If C0 equals zero and C1 equals one, then Protocol-3 is entered as shown in block 158. If C0 equals one and C1 equals one, then Protocol-4 is entered as shown in block 160. After completing the Protocol, an End of Test state 162 is entered until the EQENA signal changes from one to zero. When EQENA equals zero, the IDLE mode 150 is resumed.

FIG. 11b illustrates a protocol which allows a single test operation to be performed in response to an expected condition on the EVENT input to the EQM controller 90. Referring to FIG. 11a, if C0=0 and C1=0 when the EQENA input is set high, the EQM controller 90 will exit the IDLE state and enter the Protocol-1 state diagram via the Event Command Interpreter state. In the IDLE state and during Protocol-1, the Address output from the EQM controller 90 remains low to output the Start EXPDAT and CMPMSK patterns to TCR2 22 (FIG. 8).

After entering the Protocol-1 state diagram, the EQM will transition into the DECNT state as shown in block 164. In the DECNT state, the EQM 30 outputs a CKCNT signal to decrement the counter in the EQM scan path (FIG. 6). The counter 96 will have been loaded, via a scan operation, with the number of times Protocol-1 will be repeated. From the DECNT state the EQM 30 enters into the POLLING state (block 166).

In the POLLING state, the EQM 30 inspects the condition of the EVENT input. If the EVENT input is low, the EQM 30 remains in the Polling state. If the EVENT input is high, the EQM transitions from the POLLING state into the DO TEST state (block 168).

In the DO TEST state the TGATE and TGATEZ outputs from the EQM 30 are set high and low, respectively. The on-line test operation (Dynamic Data Sample or Dynamic Test Data Insertion) is performed in the DO TEST state while the TGATE and TGATEZ inputs are set high and low, respectively.

From the DO TEST state, the EQM 30 enters into the Wait state (block 170). After entering the Wait state, the TGATE and TGATEZ outputs from the EQM 30 are set back to a low and high level, respectively, to terminate the on-line test operation. The EQM 30 will remain in the Wait state while the EVENT input is high. After the EVENT input goes low, the EQM 30 will either: (1) transition to the DECNT state (block 164) if the CEZ input is high and repeat the Protocol-1 test operation, or (2) terminate the Protocol-1 test operation and enter into the End Of Test state (block 162) if the CEZ input is low.

The EQM 30 will remain in the End Of Test state while the EQENA input is high. When EQENA is set low, the EQM will transition to and remain in the IDLE state.

The EQM Protocol-2 allows a test operation to be performed while an expected condition is input on the EVENT input of the EQM controller 90. In FIG. 11a, if C0=1 and C1=0 when the EQENA input is set high, the EQM controller 90 will exit the IDLE state and enter the Protocol-2 state diagram shown in FIG. 11c via the Event Command Interpreter state. In the IDLE state and during Protocol-2, the Address output from the EQM controller 90 remains low to output the Start EXPDAT and CMPMSK patterns to TCR2 22 (see FIG. 8).

Protocol-2 is illustrated in FIG. 11c. The only difference between Protocol-2 and Protocol-1 is that the test operation in Protocol-2 continues as long as the EVENT input is high, whereas in Protocol-1, only a single test operation is performed regardless of the length of time the EVENT input is high.

Protocol-3, shown in FIG. 11d, allows a test operation to be performed over an interval of time between a START condition and STOP condition on the EVENT input to the EQM controller 90. If C0=0 and C1=1 when the EQENA input is set high, the EQM controller 90 will exit the IDLE state and enter the Protocol-3 state diagram via the Event Command Interpreter state. The Address output from the EQM controller 90 is low during the IDLE state to output the Start EXPDAT and CMPMSK patterns to TCR2 22.

After entering the Protocol-3 state diagram, the EQM 30 will transition into the DECNT state (block 170). The EQM Address output is low during the DECNT state to output the Start EXPDAT and CMPMSK patterns to TCR2 22. In the DECNT state, the EQM 30 outputs a CKCNT signal to decrement the counter in the EQM scan path (FIG. 6). The counter will have been loaded, via a scan operation, with the number of times Protocol-3 will be repeated. From the DECNT state the EQM 30 enters into the POLLING state.

In the POLLING state (block 172), the EQM 30 inspects the condition of the EVENT input. The Address output from the EQM controller 90 remains low during the Polling state. If the EVENT input is low, the EQM 30 remains in the POLLING state. If the EVENT input is high, the EQM 30 transitions from the Polling state into the START state.

In the START state (block 174), the TGATE and TGATEZ outputs from the EQM 30 are set high and low, respectively. The Address output from the EQM controller 90 remains low during the START state. The on-line test operation (Dynamic PSA or Dynamic Test Data Insert) to be performed is initiated in the START state when the TGATE and TGATEZ outputs are set high and low, respectively. The EQM 30 will remain in the START state while the EVENT input is high. When the EVENT input is low, the EQM 30 will transition from the START state to the DO TEST state (block 176).

In the DO TEST state, the TGATE and TGATEZ outputs remain set high and low, respectively, and the test operation initiated in the START state will continue. The Address output from the EQM controller 90 is set high in the DO TEST state to output the Stop EXPDAT and CMPMSK patterns to TCR2 22. The EQM 30 will remain in the DO TEST state while the EVENT input is low. When the EVENT input is high, the EQM 30 will transition from the DO TEST state to the STOP state (block 178).

In the STOP state, the TGATE and TGATEZ outputs from the EQM 30 are set back to a low and high level, respectively, to terminate the on-line test operation. The Address output from the EQM controller 90 remains high during the STOP state. The EQM 30 will remain in the STOP state while the EVENT input is high. After the EVENT input goes low, the EQM 30 will either: (1) transition to the DECNT state (block 170) if the CEZ input is high and repeat the Protocol-3 test operation, or (2) terminate the Protocol-3 test operation and enter into the End Of Test state if the CEZ input is low.

The EQM 30 will remain in the End Of Test state while the EQENA input is high. When EQENA is set low, the EQM 30 will transition to and remain in the IDLE state. The Address output from the EQM controller is set low in the End Of Test state.

FIG. 11e illustrates a flow chart of Protocol-4. This protocol is similar to Protocol-3 in that it allows a test operation to be performed over an interval of time between a START condition and a STOP condition on the EVENT input to the EQM controller 90. However, Protocol-4 includes a PAUSE and RESUME protocol embedded between the START and STOP protocol. This capability allows a test operation that has been started to be temporarily suspended over an interval of time between a PAUSE condition and a RESUME condition on the EVENT input to the EQM controller 90.

This protocol is useful during dynamic PSA test operations in that it allows deleting sections of data which are not to be included in the signature being taken. For example, if a signature is required on certain addresses of a memory access routine, this protocol could be used to initiate PSA on the occurrence of a desired starting address, then pause on the occurrence of an undesired address, then resume again on the occurrence of a desired address until a stop address is found.

In FIG. 11a, if $C0=1$ and $C1=1$ when the EQENA input is set high, the EQM controller will exit the IDLE state and enter the Protocol-4 state diagram illustrated in FIG. 11e via the Event Command Interpreter state. The Address output from the EQM controller 90 is low during the IDLE state to output the Start EXPDAT and CMPMSK patterns to TCR2 22.

After entering the Protocol-4 state diagram, the EQM 30 will transition into the DECNT state (block 180). The Address output from the EQM controller 90 remains low during the DECNT state. In the DECNT state the EQM 30 outputs a CKCNT signal to decrement the counter 96 in the EQM scan path. The counter 96 will have been loaded, via a scan operation, with the number of times Protocol-4 will be repeated. From the DECNT state the EQM 30 enters into the POLLING state (block 182).

In the POLLING state, the EQM 30 inspects the condition of the EVENT input. The Address output from the EQM controller 90 remains low during the POLLING state. If the EVENT input is low, the EQM 30 remains in the Polling state. If the EVENT input is high, the EQM 30 transitions from the Polling state into the START state (block 184).

In the START state, the TGATE and TGATEZ outputs from the EQM 30 are set high and low, respectively. The Address output from the EQM controller 90 remains low during the START state. The on-line test operation (dynamic PSA or dynamic test data insertion) to be performed is initiated in the START state when the TGATE and TGATEZ outputs are set high and low, respectively. The EQM 30 will remain in the START state while the EVENT input is high. When the EVENT input is low, the EQM 30 will transition from the START state to the DO TEST state (block 186).

In the DO TEST state, the TGATE and TGATEZ outputs remain set high and low, respectively, and the test operation initiated in the START state will continue. The address output from the EQM controller 90 is set high in the DO TEST state to output the Stop EXPDAT and CMPMSK patterns to TCR2 22. The EQM 30 will remain in the DO TEST state while the EVENT input is low. When the EVENT input is high, the EQM 30 will transition from the DO TEST state to the PAUSE state (block 188).

In the PAUSE state, the TGATE and TGATEZ outputs from the EQM 30 are set back to a low and high level, respectively, to suspend the on-line test operation. The Address output from the EQM controller 90 remains high during the PAUSE state. The EQM 30 will remain in the PAUSE state while the EVENT input is high. After the EVENT input goes low, the EQM 30 will transition from the PAUSE state to the WAIT state (block 190).

The EQM 30 will remain in the WAIT state while the EVENT input is low. The Address output from the EQM controller 90 is set low in the WAIT state to output the Start EXPDAT and CMPMSK pattern to TCR2 22. In the WAIT state, the TGATE and TGATEZ outputs from the EQM 30 remain low and high, respectively. After the EVENT input goes high, the EQM 30 will transition from the WAIT state to the RESUME state (block 192).

In the RESUME state, the TGATE and TGATEZ outputs from the EQM 30 are set high and low, respectively, to re-initiate the on line test operation. The Address output from the EQM controller 90 remains low during the RESUME state. The EQM 30 will remain in the RESUME state while the EVENT input is high. After the EVENT input goes low, the EQM 30 will transition from the RESUME state to the DO TEST state (block 194).

In the DO TEST state, the TGATE and TGATEZ outputs remain set high and low, respectively, and the test operation re-initiated in the RESUME state will continue. The Address output from the EQM controller 90 is set high in the DO TEST state to output the Stop EXPDAT and CMPMSK pattern to TCR2 22. The EQM 30 will remain in the DO TEST state while the EVENT input is low. When the EVENT input is high, the EQM 30 will transition from the DO TEST state to the STOP state (block 196).

In the STOP state, the TGATE and TGATEZ outputs from the EQM 30 are set back to a low and high level, respectively, to terminate the on-line test operation. The Address output from the EQM controller 90 remains high during the STOP state. The EQM 30 will remain in the STOP state while the EVENT input is high. After the EVENT input goes low, the EQM 30 will either: (1) transition to the DECNT state if the CEZ input is high and repeat the Protocol-4 test operation, or (2) terminate the Protocol-4 test operation and enter into the End of Test state (block 162) if the CEZ input is low.

The EQM 30 will remain in the End Of Test state while the EQENA input is high. When EQENA is set low, the EQM 30 will transition to and remain in the IDLE state. The Address output from the EQM controller 90 is set low in the End Of Test state.

Additional protocols may be included in the EQM by increasing the number of command bits (C0, C1, C2, C3...) in the EQM control register 88. Some of these additional protocols will have multiple PAUSE and RESUME states embedded between the START and STOP states to enhance the EQM's ability to control a test operation. These protocols will be of the form shown below to increase the number of PAUSE and RESUME states between the primary START and STOP states:

(START)—(PAUSE1/RESUME1)—(PAUSE2/-
RESUME2)...
(PAUSEn/RESUMEn)—(STOP)

In addition, other protocol formats can be added to provide communication between ICs to support other tests and/or functional purposes.

Dynamic Test Instructions

The Dynamic Test Data Insertion Instruction allows a test pattern that has been installed in TCR2 22, via a prior scan operation, to be inserted onto the Q0-7 outputs in response to a condition. The response can be a condition occurring locally at the output boundary of the IC 10 in FIG. 1, or it can be a condition occurring over a range of ICs as shown in FIG. 5. The following instructions define the types of test data insertion operations the advanced test register can perform.

The Single Test Data Insertion Instruction illustrated in FIG. 12 allows test data to be inserted from the Q0-7 outputs during a qualified CLK input. This instruction operates using a Protocol-1 EQM command. In the Protocol-1 example of FIG. 12, it is seen that test data is inserted when the TGATE output from the EQM is set high on the rising edge of CLK' "C". The TGATE output is coupled to the DMX' input of TCR2 22 via multiplexer 142 in FIG. 8. The test circuits 54 of TCR2 22 respond to a high input on their DMX inputs by switching their DOUT outputs to drive out the value stored in their output latches (see FIG. 4). During insert operations the control inputs to TCR2 22 are arranged to where they do not interfere with the test data insert operation.

This instruction is useful in the design of state machines using the advanced test register since it would be possible to cause the test register to insert a next state pattern to modify the behavior of the state machine. Branching operations are possible via the insert feature.

FIG. 13 illustrates the Extended Single Test Data Insertion Instruction (Protocol-2). This instruction allows the test data to be inserted from the Q0-7 outputs of the IC 10 while the EVENT input to the EQM controller 90 is set high. This instruction operates using a Protocol-2 EQM command and is similar to the Single Test Data Insertion Instruction. In the Protocol-2 example of FIG. 12, it is seen that the test data is inserted from the Q0-7 outputs from the rising edge of CLK' "C" to the rising edge of CLK' "F". The TGATE output is coupled to the DMS' input to TCR2 22 via the multiplexer 142 in FIG. 8. The test circuits 54 of TCR2 22 respond to a high input on their DMX inputs by switching their DOUT outputs to drive out the value stored in their output latches (see FIG. 4).

This instruction is useful from the fact that it allows test data to be output on the Q0-7 outputs over an extended range. This capability can be used to insert a fault onto system buses during normal operation to see if fault tolerant designs can reconfigure themselves to maintain normal operation.

The START/STOP Test Data Insertion Instruction illustrated in FIG. 14 allows test data to be inserted from the Q0-7 outputs for the time interval between a start condition and a stop condition. This instruction uses a Protocol-3 EQM command. In the Protocol-3 example if FIG. 14, it is seen that test data is inserted while the TGATE output is set high. The TGATE output is set high when a start condition is found and remains high until a stop condition is found. The test circuits of TCR2 22 respond to a high TGATE input as described in the Protocol-1 instruction.

This instruction allows inserting a test pattern on the test registers Q0-7 outputs for an extended period of time. A useful capability of this feature is to force a fault to be output from the test register.

The START/PAUSE/RESUME/STOP Test Data Insertion Instruction of FIG. 15 allows test data to be inserted from the Q0-7 outputs for the time interval between a first start and stop condition, then again on a second start and stop condition. This instruction uses a Protocol-4 EQM command. In the Protocol-4 example in FIG. 15, it is seen that the test data is inserted while the TGATE output is set high. The TGATE output goes high when a start condition occurs and remains high until a pause condition occurs. The TGATE will go high again when a resume condition occurs and remain high until a stop condition occurs. The test circuits of TCR2 22 respond to a high TGATE input as described in the Protocol-1 instruction.

This instruction allows expanding the test data insert capability to where the insert operation can occur during two differently qualified time windows, per Protocol-4 sequence.

The DYNAMIC DATA SAMPLE Instruction of FIG. 16 allows input data appearing on the D0-7 input to be sampled into the test circuits of TCR1 12 during a qualified CLK input. This instruction operates using a Protocol-1 EQM command In the Protocol-1 example of FIG. 16a, it is seen that input data is sampled while the TGATEZ output from the EQM 30 is set low and on the rising edge of CLK' "C". The TGATEZ output is coupled to the B1' input of TCR1 12 in FIG. 9 via multiplexer 148. During the dynamic sample operation, the A1' input is set high by multiplexer 148. While TGATEZ is high, the test circuits in TCR1 12 are in the Hold Mode (AB=11) as shown in Table 1. When TGATEZ goes low, the B1' input goes low and the test circuits in TCR1 12 are placed in the Load Mode (AB=10) for one sample clock cycle. After the sample is complete (TGATEZ goes back high), the Hold Mode is re-entered. Data Sample Instructions illustrated in FIGS. 16b-d are discussed in connection with FIG. 20 hereinbelow.

In order to provide stable data sampling, the EQCK of the EQM (see FIG. 6) is inverted via the exclusive OR gate and high logic state of the CKPOL input from the EQM control register 88.

After the data has been sampled, the TCR's inputs can be adjusted so that the sampled data can be shifted out for inspection.

The dynamic PSA instructions allow the data entering the IC 10 on the D0-7 inputs to be compressed into a sixteen bit signature using TCR1 and TCR2 in combination as shown in FIG. 10. The PSA operation is performed in response to a condition. The response can be a condition occurring locally at the output boundary of the IC 10 in FIG. 1, or it can be a condition occurring over a range of ICs as shown in FIG. 5. The following instructions define the types of PSA instructions the advanced test register can perform.

The SINGLE EVENT QUALIFIED PSA Instruction illustrated in FIG. 17 allows the input data appearing on the D0-7 inputs to be compressed into a sixteen-bit signature while the EVENT input to the EQM controller 90 is set high. During this operation, TCR1 12 and TCR2 22 are linked together as shown in FIG. 10 to form a sixteen-bit signature analyzer register. This instruction operates using a Protocol-2 EQM command. In the Protocol-2 example of FIG. 17, it is seen that the input data on D0-7 is sampled while the TGATEZ output from the EQM 30 is set low and on the rising edge of the CLK' input. The TGATEZ output causes the test circuits 54 of TCR1 12 to be in Load Mode (AB=10) while low, and Hold Mode (AB=11) while high as described in the Dynamic Data Sample instruction. In addition, the TGATEZ output is input to TCR2 22 during PSA operations to cause the test circuits 54 of TCR2 22 to be in the Shift Mode (AB=00) while TGATEZ is low, and Hold Mode (AB=11) while TGATEZ is high. By causing TCR1 12 to load and TCR2 22 to shift when TGATEZ is low, the D0-7 input data can be compressed into a sixteen-bit signature while the EVENT input is set to a high logic level.

The TGATE output from the EQM 30 is decoupled from the DMX' input of TCR2 22 and has no effect on the TCRs during PSA or Sample testing. After the signature has been taken, the TCR's inputs can be adjusted so that the signature can be shifted out from the IC 10 for inspection.

This instruction is useful in compressing a stream of data flowing through the IC 10. Control of when the data is to be compressed is input to the EQM 30 via either the EQIN input or internal CTERM input.

The START/STOP PSA Instruction illustrated in FIG. 18 allows input data appearing on the D0-7 input to be compressed into a sixteen-bit signature over the interval between a start condition and a stop condition. During this operation, TCR1 12 and TCR2 22 are linked together as shown in FIG. 10 to form a sixteen-bit signature analyzer register. This instruction operates using a Protocol-3 EQM command. In the Protocol-3 example of FIG. 18, it is seen that the input data on D0-7 is sampled while the TGATEZ output from the EQM 30 is set low and on the rising edge of the CLK' input. The TGATEZ output causes the test circuits 54 of TCR1 12 to be in Load Mode (AB=10) while low, and Hold Mode (AB=11) while high as described in the Dynamic Data Sample instruction. In addition, the TGATEZ output is input to TCR2 22 during PSA operations to cause the test circuits 54 of TCR2 22 to be in the Shift Mode (AB=00) while TGATEZ is low, and Hold Mode (AB=11) while TGATEZ is high. By causing TCR1 12 to load and TCR2 22 to shift when TGATEZ goes low, the D0-7 input data can be compressed into a sixteen-bit signature over a qualified starting and stopping condition.

The TGATE output from the EQM 30 is decoupled from the DMX' input of TCR2 22 and has no effect on the TCRs during PSA or Sample testing. After the signature has been taken, the TCR's inputs can be adjusted so that it can be shifted out from the IC 10 for inspection.

This instruction is useful in compressing a stream of data flowing through the IC 10 over a start/stop range.

The START/PAUSE/RESUME/STOP PSA Instruction illustrated in FIG. 19 allows input data appearing on the D0-7 input to be compressed into a sixteen-bit signature over the interval between a start condition and a pause condition, then again between a resume condition and a stop condition. This instruction operates using the Protocol-4 instruction shown in FIG. 19. In the Protocol-4 example, the input data on D0-7 is sampled while the TGATEZ is low. The TGATEZ output goes low when a start condition occurs and remains low until a pause condition occurs. The TGATEZ will go low again when a resume condition occurs and remains low until a stop condition occurs. The TGATEZ output from the EQM 30 is used to cause TCR1 12 and TCR2 22 to operate as described in the Start/Stop PSA operation. After the signature has been taken, the TCR's inputs can be adjusted so that signature can be shifted out from the IC 10 for inspection.

This instruction is useful in compressing a stream of data flowing through the IC 10 over a start/pause/resume/stop range.

Expanded Test Data Sample and Insertion Capability

To expand the number test patterns sampled during Dynamic Test Data Sampling and the number of test patterns inserted during a Dynamic Test Data Insertion operation, a test pattern memory buffer can be included in the architecture of FIG. 1.

Figure 20:
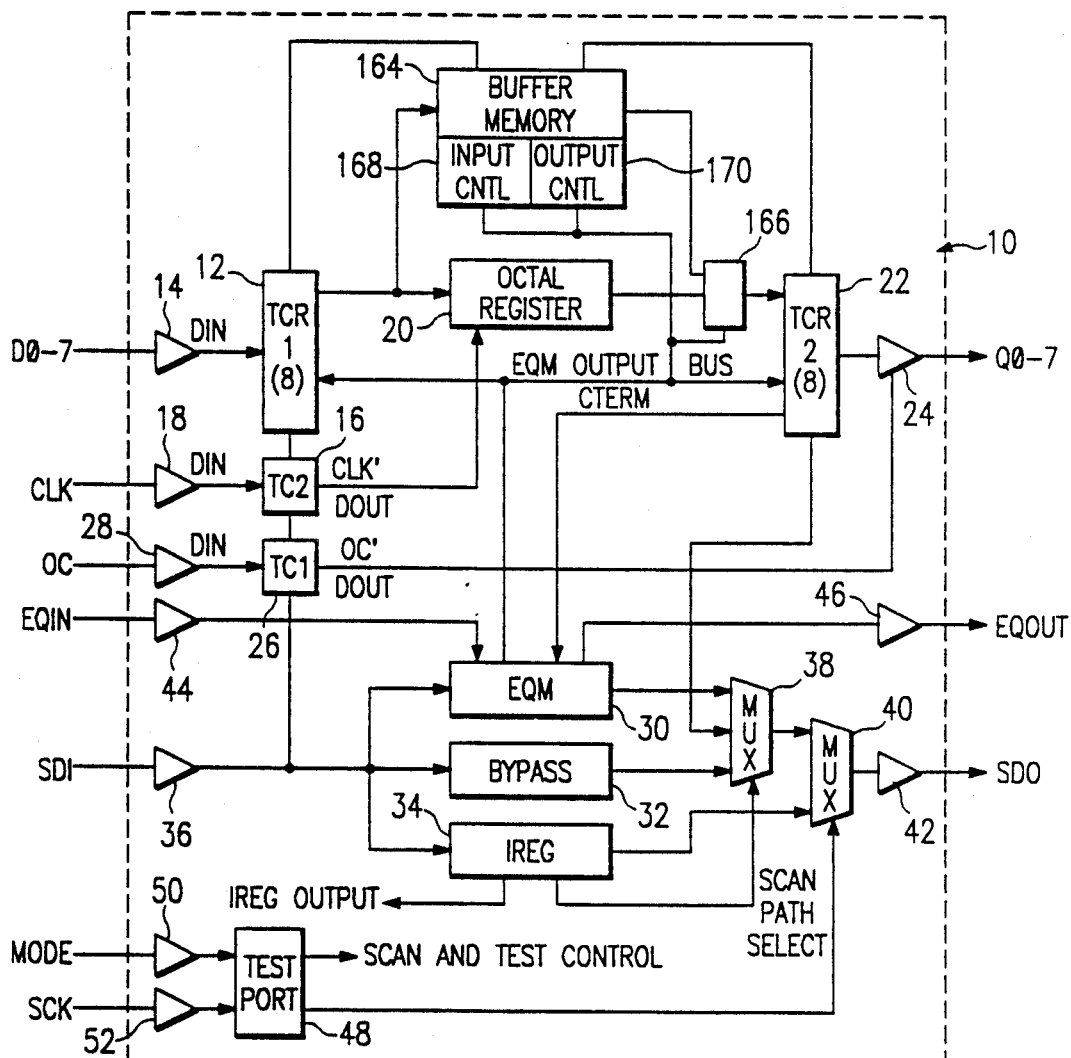
FIG. 20 illustrates a block diagram of a second embodiment of the present invention using a memory buffer.

In FIG. 20, a memory buffer (RAM) is included in the circuit design. The input to the memory buffer 164 is connected to the output of TCR1 12 and the output of the memory buffer 164 is connected to the input of TCR2 22, via a multiplexer 166. The serial scan path passes through the memory buffer 164 to allow loading and unloading of the memory via the serial test interface. The memory buffer 164 receives control inputs from the EQM output bus during Event Qualified testing. The memory buffer 164 includes input control circuitry 168 that responds to the EQM control inputs to allow incoming data on D0-7 to be stored during test data sample operations. The memory buffer 164 also includes output control circuitry 170 that responds to EQM control inputs to allow outputting stored test data on Q0-7 during test data insertion operations via the multiplexer 166. The memory buffer 164 has internal addressing logic to access the next memory location after a write or read operation.

Buffered Test Data Sampling

Since the memory buffer 164 provides storage for more than one incoming data input, the use of the other protocols (2, 3, and 4) for data sampling can be applied. The following is a description of how each of the other protocols are used to store multiple patterns into the memory buffer during event qualified data sample operations. After utilizing one of the protocols to store incoming data patterns, a scan operation can be used to remove the stored patterns from the memory buffer.

The advantages of being able to store multiple input data patterns during test is that it gives additional insight into the functional operation of one or more of the devices in a circuit.

During a Protocol-2 instruction, the normal system data entering the IC 10 of FIG. 20 is stored into the memory buffer 164 while the EVENT input to the EQM controller 90 is set high as shown in the timing waveforms of FIG. 16b. The incoming data is stored into memory buffer 164 during each high pulse of the CLK' input while the TGATEZ signal is low. The internal addressing logic of the memory buffer 164 increments to the next memory location after data has been written into the current location.

During a Protocol-3 instruction, the normal system data entering the IC 10 of FIG. 20 is stored into the memory buffer 164 over a qualified time interval determined by the Start event input and Stop event input shown in the timing waveforms of FIG. 16c. The incoming data is stored in the memory buffer 164 during each high pulse of the CLK' input while the TGATEZ input is low. The addressing logic circuitry of the memory buffer 164 increments to the next memory location after data has been written into the current location.

During a Protocol-4 instruction, the normal system data entering the IC 10 of FIG. 20 is stored into the memory buffer 164 over a qualified time interval determined by the Start Event input and Stop Event input shown in the timing waveforms of FIG. 16d. The incoming data is stored in the memory buffer 164 during each high pulse of the CLK' input while the TGATEZ input is low. Since this protocol includes Pause and Resume conditions, the data sample operation can be temporarily paused then resumed to allow omitting undesired sections of incoming data patterns. The addressing logic of the memory buffer 164 increments to the next memory location after data has been written into the current location.

Buffered Test Data Insertion

Since the memory buffer 164 provides storage for multiple test data patterns, the dynamic test data insertion operations described in connection with FIG. 12-15 can be used to insert a series of test patterns onto the Q0-7 output bus. The following is a description of how each of the Protocols (2,3, and 4) are used to insert multiple test patterns onto the Q0-7 output bus during dynamic test data insertion operations. Prior to executing the insert test operations, the memory buffer 164 will have been loaded with the desired test patterns to be inserted.

During buffered test data insertion, the EQM 30 outputs control to multiplexer 166 to cause the test data from the memory buffer to be output on the Q0-7 outputs of the IC 10, via TCR2 22. When test patterns are being inserted from the memory buffer 164, the test circuits 54 of TCR2 22 must maintain the connection between the inputs from the multiplexer 166 and the Q0-7 outputs of the IC 10. A control circuit 300 to achieve this connection is shown in FIG. 21.

Figure 21:
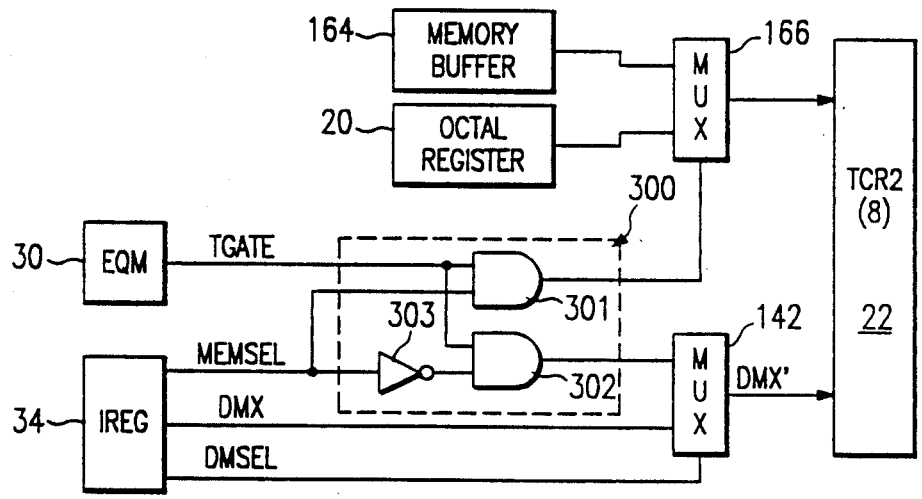
FIG. 21 illustrates a block diagram of a circuit to output data from said memory buffer.

The control circuit 300 in FIG. 21 allows the TGATE output from the EQM 30 to be input to either the multiplexer 166 or the test circuits 54 in TCR2 22. The control circuit 300 consists of two AND gates 301 and 302 and one inverter 303. AND gate 301 has inputs connected to the TGATE signal from EQM 30 and the MEMSEL signal from IREG 34 and is connected to the control input to multiplexer 166. AND gate 302 has inputs connected to the TGATE signal and to the MEMSEL signal through inverter 303. The output of AND gate 302 is connected to multiplexer 142. When data is to be inserted from the test circuits of TCR2 22, the control circuit will be set by a control input from the IREG 34 (MEMSEL) to allow the TGATE input to pass through to the output of the AND gate 302, while forcing the output of the AND gate 301 low. When data is to be inserted from the memory buffer 164 outputs, the control input (MEMSEL) from the IREG 34 will be set to allow the TGATE input to pass through to the output of the AND gate 301, while forcing the output of the AND gate 302 low. While the output of AND gate 302 is set low, the test circuits 54 of TCR2 22 allow the test data output from the multiplexer 166 to be output on the Q0-7 outputs of the IC 10.

The ability to insert multiple test patterns onto the Q0-7 output bus during test provides the advantage of providing additional dynamic test control capabilities in one or more of the devices in a circuit.

During a Protocol-2 instruction , stored test data can be inserted onto the Q0-7 output bus of the IC 10 of FIG. 20 from the memory buffer outputs. The test data is inserted while the EVENT input to the EQM controller 90 is set high, as shown in the timing waveforms of FIG. 13. The data to be inserted is made available on the memory buffer outputs while the TGATE signal is high. The addressing logic in the memory buffer 164 accesses and outputs stored test data on the rising edge of the CLK' input.

During a Protocol-3 instruction, stored test data can be inserted onto the Q0-7 output bus of the IC 10 of FIG. 20 from the memory buffer outputs. The test data is inserted over a qualified time interval determined by the Start Event input and Stop Event input shown in the timing waveforms of FIG. 14. The data to be inserted is made available on the memory buffer outputs while the TGATE signal is high. The addressing logic in the memory buffer accesses and outputs stored data on the rising edge of the CLK' input.

During a Protocol-4 instruction, stored test data can be inserted onto the Q0-7 output bus of the IC 10 of FIG. 20 from the memory buffer outputs. The test data is inserted over a qualified time interval determined by the Start Event input and Stop event input shown in the timing waveforms of FIG. 15. The data to be inserted is made available on the memory buffer outputs while the TGATE signal is high. The addressing logic in the memory buffer accesses and outputs stored test data on the rising edge of the CLK' input. Since this protocol includes Pause and Resume conditions, the data insert operation can be temporarily paused then resumed to allow inserting test data only during desired intervals of time. Normal system data is output when the test data insert operation is suspended.

Inserting Test Patterns Generated From TCR2

To provide still another type test data insertion capability, the test circuits 54 of TCR2 22 can be made to operate in a pattern generation made. In the pattern generation mode TCR2 22 can be configured to output test patterns in the form of Toggle, Psuedorandom, or Binary count up/down patterns. These pattern generation capabilities are described in U.S. Patent application Ser. No. 241,439 referenced above. Using the EQM, the test circuits in TCR2 can be enabled during normal operation of the device to generate test patterns to be inserted onto the Q0-7 output bus.

During a Protocol-2 instruction, the test circuit 54 in TCR2 22 can be activated by the EQM controller 90 to generate and insert test patterns onto the Q0-7 output bus of the IC 10 of FIG. 1 and FIG. 20. The generated test patterns are inserted while the Event input to the EQM controller is set high, as shown in the timing waveforms of FIG. 13. The data to be inserted is made available from the output of TCR2 22 while the TGATE signal is high. TCR2 22 generates and outputs the test data pattern on the rising edge of the CLK' input.

During a Protocol-3 instruction, the test circuits in TCR2 22 can be activated by the EQM controller 90 to generate and insert test patterns onto the Q0-7 output bus of the IC 10 of FIG. 1 and FIG. 20. The generated test patterns are inserted over a qualified time interval determined by the Start event input and Stop event input shown in the timing waveforms of FIG. 14. The data to be inserted is made available from the output of TCR2 22 while the TGATE signal is high. TCR2 22 generates and output the test data pattern on the rising edge of the CLK' input.

During a Protocol-4, the test circuits in TCR2 can be activated by the EQM controller to generate and insert test patterns onto the Q0-7 output bus of the IC 10 of FIG. 1 and FIG. 15. The generated test patterns are inserted over a qualified time interval determined by the Start Event input and Stop Event input shown in the timing waveforms of FIG. 15. The data to be inserted is made available from the output of TCR2 while the TGATE signal is high. TCR2 generates and outputs the test data pattern on the rising edge of the CLK' input. Since this protocol includes Pause and Resume conditions, the test data generation and insert operation can be temporarily paused then resumed to allow inserting test data only during desired intervals of time. Normal system data is output when the test data insert operation is suspended.

Although the present invention has been described in detail, it should be understood that various changes, substitutions and alterations can be made herein without departing from the spirit and scope of the invention as defined by the appended claims.

What is claimed is:

1. A test architecture for use in an integrated circuit, the test architecture comprising:
   input circuitry on the integrated circuit for receiving incoming data;
   output circuitry on the integrated circuit for outputting data from the integrated circuit;
   application logic circuitry connected between said input and output circuitry for performing a desired function on said incoming data; and
   test circuitry connected to said input and output circuitry for storing data in response to a predetermined condition in the logic circuitry detected by the test circuitry while the integrated circuit is in a functioning mode.

2. The test architecture of claim 1 wherein said test circuitry comprises:
   input test circuitry connected to said input circuitry;
   output test circuitry connected to said output circuitry; and
   event qualification circuitry connected to said input and output test circuitry to indicate when said predetermined condition has occurred.

3. The test architecture of claim 2 wherein input test circuitry is operable to perform signature analysis on said incoming data in response to said predetermined condition.

4. The test architecture of claim 2 wherein said test circuitry further comprises a counter operable to count the number of storage operations performed by said test circuitry.

5. The test architecture of claim 2 wherein said test circuitry further comprises an expected data memory for storing an expected data word associated with said predetermined condition.

6. The test architecture of claim 5 wherein said input test circuitry is operable to compare said expected data word with data words received by said input circuitry and is operable to indicate whether said data received by said input circuitry matches said expected data word.

7. The test architecture of claim 5 wherein said output test circuitry is operable to compare said expected data word with data words received from said logic circuitry and is operable to indicate whether said data received from said logic circuitry matches said expected data word.

8. The test architecture of claim 7 and further comprising a masking data memory for storing a masking data word associated with said expected data word, the masking data word being coupled to the test circuitry and operable such that said masking data word identifies portions of said expected data word where matching is not required for identification.

9. The test architecture of claim 8 wherein said expected data memory comprises a plurality of expected data words.

10. The test architecture of claim 1 and further comprising scan path circuitry, coupled to the expected data and masking data memories, for transferring said stored data from the integrated circuit separate from said output circuitry such that the normal data flow through said output circuitry is not interrupted by said transfer.

11. The test architecture of claim 1 and further comprising a test memory buffer to store said incoming data responsive to said predetermined condition.

12. The test architecture of claim 1 wherein said testing circuitry is operable to start storing data in response to a first predetermined condition and operable to stop storing data in response to a second predetermined condition.

13. The test architecture of claim 11 wherein said testing circuitry is operable to resume storing data after a third predetermined condition and stop storing data after a fourth predetermined condition.

14. The test architecture of claim 1 wherein said logic circuitry comprises a register.

15. The test architecture of claim 1 wherein said logic circuitry comprises a first-in, first-out memory.

16. The test architecture of claim 1 wherein said logic circuitry comprises a microprocessor.

17. A boundary test architecture for use in an integrated circuit, the boundary test architecture comprising:
   input circuitry in the integrated circuit for receiving incoming data;
   output circuitry in the integrated circuit for outputting data from the integrated circuit;
   application logic circuitry connected between said input and output circuitry for performing a desired function on said incoming data; and
   test circuitry in the integrated circuitry connected to said output circuitry for inserting boundary test data to be output from the integrated circuit in response to a predetermined condition detected by the test circuitry in the logic circuitry while the integrated circuit is in a functioning mode.

18. The testing architecture of claim 17 wherein said test circuitry comprises:
   input test circuitry connected to said input circuitry;
   output test circuitry connected to said output circuitry; and
   event qualification circuitry connected to said input and output test circuitry to indicate when said predetermined condition has occurred.

19. The test architecture of claim 18 wherein said test circuitry further comprises an expected data memory for storing an expected data word associated with said predetermined condition.

20. The test architecture of claim 19 wherein said output test circuitry is operable to compare said expected data word with data words received from said logic circuitry and is operable to indicate whether said data received from said logic circuitry matches said expected data word.

21. The test architecture of claim 19 wherein said input test circuitry is operable to compare said expected data word with data words received from said input circuitry and is operable to indicate whether said data received from said input circuitry matches said expected data word.

22. The test architecture of claim 20 and further comprising a masking data memory for storing a masking data word associated with said expected data word, the masking data word being coupled to the test circuitry and operable such that said masking data word identifies portions of said expected data word where matching is not required for identification.

23. The test architecture of claim 17 wherein said output test circuitry is operable to load a data word to be inserted from said event qualification circuitry prior to the occurrence of said predetermined condition.

24. The test architecture of claim 17 and further comprising scan path circuitry separate from said output circuitry such that said output test circuitry can be loaded with said data to be inserted without interrupting normal data flow through said output circuit.

25. The test architecture of claim 17 and further comprising a buffer memory coupled to the output circuitry for storing a plurality of data words to be output from the integrated circuit in response to said predetermined condition.

26. The test architecture of claim 25 wherein said output test circuit is operable to output sequential ones of data words from said buffer memory in response to a first predetermined condition and operable to stop outputting data words from said buffer memory in response to a second predetermined condition.

27. The test architecture of claim 26 wherein said output test circuit is operable to resume outputting of sequential data words from said buffer memory in response to a third predetermined condition and operable to stop outputting data words from said buffer memory in response to a fourth predetermined condirion.

28. The test architecture of claim 17 wherein said output test circuit is operable to output a test pattern in response to a first predetermined condition.

29. The test architecture of claim 28 wherein said output test circuit is operable to cease outputting said test pattern in response to a second predetermined condition.

30. The test architecture of claim 29 wherein said output test circuit is operable to resume output of said test pattern in response to a third output pattern.

31. The test architecture of claim 28 wherein said test pattern comprises a pseudo-random sequence.

32. The test architecture of claim 17 wherein said logic circuitry comprises a register.

33. The test architecture of claim 17 wherein said logic circuitry comprises a shift register.

34. The test architecture of claim 17 wherein said logic circuitry comprises a random access memory.

35. The test architecture of claim 17 wherein said test architecture comprises a boundary scan test architecture.

36. A method of testing integrated circuits comprising the steps of:
   receiving incoming data;
   performing a desired function on said incoming data;
   outputting data on which said function has been performed;
   detecting the occurrence of a predetermined condition while performing the desired function on said incoming data; and
   processing input data in response to said predetermined condition while the integrated circuit is in the functioning mode.

37. The method of claim 36 wherein said step of detecting the predetermined condition comprises the step of comparing the data being output with predetermined expected data.

38. The method of claim 36 wherein said step of detecting the predetermined condition comprises the step of comparing said incoming data with predetermined expected data.

39. The method of claim 37 wherein the step of comparing comprises the step of comparing portions of an expected data word with the data being output to determine a match condition.

40. The method of claim 36 wherein said processing step comprises the step of performing signature analysis on said incoming data.

41. The method of claim 36 and further comprising the step of transferring said processed data from the integrated circuit on a path separate from said output circuitry such that the normal data flow through said output circuitry is not interrupted by said transfer.

42. The method of claim 36 wherein said step of processing data comprises the step of storing data in sequential locations in a memory buffer.

43. The method of claim 36 and further comprising the step of ceasing to process said incoming data in response to a second predetermined condition.

44. The method of claim 43 and further comprising the step of resuming processing of incoming data in response to a third predetermined condition.

45. A method of testing integrated circuits comprising the steps of:
receiving incoming data;
performing a desired function on said incoming data;
detecting the occurrence of a predetermined condition while performing the desired function on said incoming data; and
outputting test data from the integrated circuit in response to the detection of the predetermined condition.

46. The method of claim 45 wherein said step of detecting the predetermined condition comprises the step of comparing the data being output with predetermined expected data.

47. The method of claim 45 wherein said step of detecting the predetermined condition comprises the step of comparing the incoming data with predetermined expected data.

48. The method of claim 46 wherein the step of comparing comprises the step of comparing portions of an expected data word with the data being output to determine a match condition.

49. The method of claim 45 wherein said step of outputting test data comprises outputting test data stored in sequential locations in a random access memory.

50. The method of claim 49 and further comprising the steps of detecting a second predetermined condition and ceasing to output data in response to detection of said second predetermined condition.

51. The method of claim 50 and further comprising the steps of detecting a third predetermined condition and resuming the output of test data in response to detection of said third predetermined condition.

* * * * *